United States Patent [19]
Ikeda et al.

[11] Patent Number: 5,629,553
[45] Date of Patent: May 13, 1997

[54] VARIABLE INDUCTANCE ELEMENT USING AN INDUCTOR CONDUCTOR

[75] Inventors: Takeshi Ikeda, 2-5-6-213, Sanno, Ohta-ku, Tokyo; Susumu Okamura, 4-1-12-1305, Hiroo, Shibuya-ku, Tokyo; Akira Okamoto, Ageo, all of Japan

[73] Assignees: Takeshi Ikeda; Susumu Okamura, Tokyo, both of Japan

[21] Appl. No.: 338,847

[22] Filed: Nov. 14, 1994

[30] Foreign Application Priority Data

Nov. 17, 1993 [JP] Japan ................... 5-311276
Jul. 29, 1994 [JP] Japan ................... 6-197210

[51] Int. Cl.⁶ .................................. H01L 29/00
[52] U.S. Cl. .................. 257/531; 257/532; 257/379; 333/185
[58] Field of Search ................ 257/531, 532, 257/379; 333/185, 245, 262

[56] References Cited

U.S. PATENT DOCUMENTS

| | | | |
|---|---|---|---|
| 4,926,292 | 5/1990 | Maple | 333/185 |
| 4,931,753 | 6/1990 | Nelson et al. | 333/161 |
| 5,021,758 | 6/1991 | Lane | 257/379 |
| 5,070,317 | 12/1991 | Bhagat | 336/200 |
| 5,281,932 | 1/1994 | Even-Or | 333/33 |

FOREIGN PATENT DOCUMENTS

| | | | |
|---|---|---|---|
| 0515821 | 12/1992 | European Pat. Off. | 333/185 |
| 3941323 | 6/1990 | Germany | 333/185 |
| 4222791 | 2/1993 | Germany | 333/185 |
| 56-90551 | 7/1981 | Japan | 257/531 |
| 60-124859 | 7/1985 | Japan | 257/531 |
| 62-244160 | 10/1987 | Japan | 257/531 |
| 4-61256 | 2/1992 | Japan | 257/532 |
| 2-211987 | 7/1989 | United Kingdom | 257/531 |

*Primary Examiner*—Minhloan Tran
*Attorney, Agent, or Firm*—Oliff & Berridge

[57] ABSTRACT

A variable inductance element comprising an inductor conductor 10 having a predetermined shape formed on an insulation layer 40 on the surface of a semiconductor substrate 42, switches 16 and 24 for shorting portions of the inductor conductor 10, and input/output terminals 12 and 14 provided at the respective ends of the inductor conductor 10. When switches 16 and/or 24 is in the on state, the function as an inductor having a smaller inductance than the overall inductor conductor 10 is obtained. The inductance of this variable inductance element can be changed by external control, while manufacturing is easy and formation in a unitized manner with an integrated circuit or other semiconductor device is enabled.

42 Claims, 31 Drawing Sheets

VARIABLE INDUCTANCE ELEMENT USING AN INDUCTOR CONDUCTOR

BACKGROUND OF THE INVENTION

1. Field of the Invention

The present invention relates to a variable inductance element having a predetermined inductance and used as either part of a semiconductor or other device, or as a discrete element.

2. Background Art

The rapid advancement of electronics technology in recent years has brought about the broad use of electronic circuits in a wide range of fields. In particular, progress in semiconductor manufacturing technology is continuing to make high integration LSI and other devices commonplace.

These type of integrated circuits comprise large numbers of semiconductor components, including NOS transistors, bipolar transistors, diodes and others. Other components, such as capacitors utilizing pn junctions and resistors with characteristics determined by the density of minority carrier in the semiconductor are also incorporated into the devices. Consequently, large scale integrated circuits (LSI) are constructed with nearly all of the individual components contained internally.

However, in the case of conventional integrated circuits, although nearly all the circuit elements could be included internally, coils had to be provided externally to the device. Also, since the inductance of a coil is determined by the coil shape, suitably changing the inductance according to requirements after fabrication was impossible. For example, a known means of variably setting the inductance is to insert a magnetic core. However, in order to change the inductance, the position of this magnetic core needs to be shifted. Therefore, manufacturing of such an inductor is complex, and use as a portion of an integrated circuit is impossible.

SUMMARY OF THE INVENTION

The present invention considers the above mentioned points and one of its objects are to provide a variable inductance element that is easy to manufacture and wherein the inductance can be changed by external control.

Another object of this invention is to provide a variable inductance element that can be formed in an integrated manner with a semiconductor device such as an integrated circuit.

In order to resolve the above mentioned problems, a variable inductance element according to the present invention comprises:
- a single or a plurality of inductor conductors having a predetermined shape, and
- a single or a plurality of switches for separating or connecting these inductor conductors, wherein the inductor conductors can be used independently or in combination.

The variable inductance element comprises one or a plurality of inductor conductors which are respectively connected or separated by switches. These inductor conductors have predetermined shapes and by changing the inductor conductor connection status by means of these switches, the overall inductance of the variable inductance element is changed accordingly. In other words, by operating the switches, the connection status of a single or a plurality of inductor conductors can be changed and as a result, the inductance is changeable.

The inductor conductor shapes include spiral, meander and others. Although forming an inductor conductor into a spiral shape is commonly known to provide a function as an inductor, an inductor function can also be provided by using meander and other shapes. Consequently, an appropriate shape can be selected in order to obtain the inductance, shape and terminal arrangement that respond to the usage objectives.

Another variable inductance element according to this invention further comprises two input/output terminals provided in proximity to the respective ends of the independent or combined inductor conductor. By operating the switches, the inductor conductor length between the two input/output terminals is changed, thereby changing the inductance between the two input/output terminals.

This variable inductance element includes two input/output terminals in proximity to the respective ends of the above mentioned single or plurality of inductors. By switch operation, the number of inductor conductors connected between these two input/output terminals is changed. Consequently, the element inductance can be changed even while the employed input/output terminals remain fixed.

Another variable inductance element according to this invention further comprises a switch for cutting off an undesired closed loop produced by inductor conductors when the above mentioned switches are operated.

In the case of this variable inductance element, an undesired closed loop produced by inductor conductors when operating the above mentioned switches can be cut off by a switch. This can prevent formation of the undesired closed loop and prevent undesired closed loop current accompanying the generation of magnetic flux.

In another aspect of this invention, the inductor conductors and switches of any one of the above mentioned variable inductance elements are formed in a unitized manner on a semiconductor substrate.

In the case of this variable inductance element, the above mentioned inductor conductors and switches are formed in unitized manner on a semiconductor substrate and the inductor conductors are connected and separated by these switches. Since this variable inductance element can be manufactured on a semiconductor substrate by utilizing ordinary semiconductor manufacturing technology (particularly NOS technology), down-sizing and mass production are easy, while the variable inductance element can also be formed in a unitized manner as a portion of a semiconductor device such as an integrated circuit or transistor.

According to another aspect of this invention, in the case of any one of the above mentioned variable inductance elements, the switch comprises a field effect transistor (FET) formed as portions of a semiconductor substrate, and the FET's two diffusion regions functioning as a source and a drain are respectively connected to different portions of the inductor conductor.

In the case of this variable inductance element, the above mentioned switch is formed by field effect transistors. Consequently, connection and separation between inductor conductors are performed by changing the voltage applied to the FET gates.

According to another aspect of this invention, in the case of any one of the above mentioned variable inductance elements, the above mentioned switch is n channel and p channel transistors connected in parallel to comprise transmission gates, and the two diffusion regions functioning as source and drain of each transistors are respectively connected to different portions of the inductors.

In the case of this variable inductance element, the above mentioned switch comprises a transmission gate of n channel and p channel transistors connected in parallel. As a result, continuously stable low resistance switching operation is possible without being influenced by a potential difference between the diffusion region functioning as a source or drain and the gate.

According to another aspect of this invention, in the case of any one of the above mentioned variable inductance elements, the switch diffusion region and channel are extended along the inductor conductor.

In the case of this variable inductance element, the switch is extended along the inductor conductor and the switch connecting portion area is enlarged. As a result the resistance when the switch is closed is reduced significantly.

According to another aspect of this invention, in the case of any one of the above mentioned variable inductance elements, after forming the switches and the inductor conductors on a semiconductor substrate, an insulation film is formed on the entire surface of the semiconductor substrate, perforations are opened in portions of the insulation film by etching or laser light emission, then the perforations are closed by applying solder to the extent of protruding slightly from the surface, thereby providing terminals.

In the case of this variable inductance element, the insulation film is formed on the entire surface of the semiconductor substrate by a method such as chemical liquid phase deposition. Perforations are then opened in portions of the insulation film by etching or laser light emission. Solder is applied to the perforations to provide terminals. Consequently, a surface mounting type element can be easily manufactured, in which case work for installing the element is also easy.

DETAILED DESCRIPTION OF THE INVENTION

Following is a description of the preferred embodiments of the variable inductance elements in accordance with this invention with reference to the attached drawings.

FIRST EMBODIMENT

Figure 1:
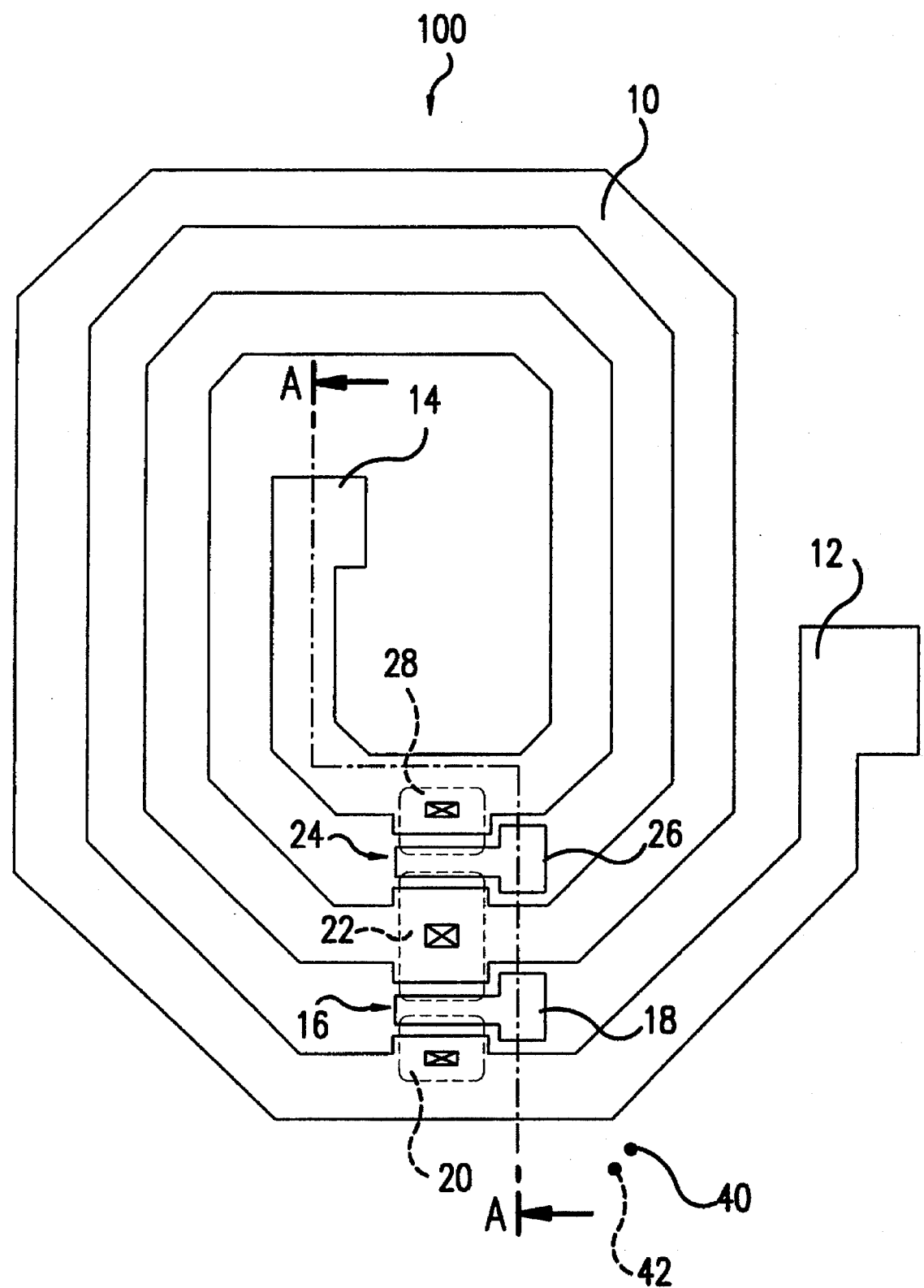
FIG. 1 is a plan view of a variable inductance element in accordance with a first embodiment of this invention.
Figure 2:
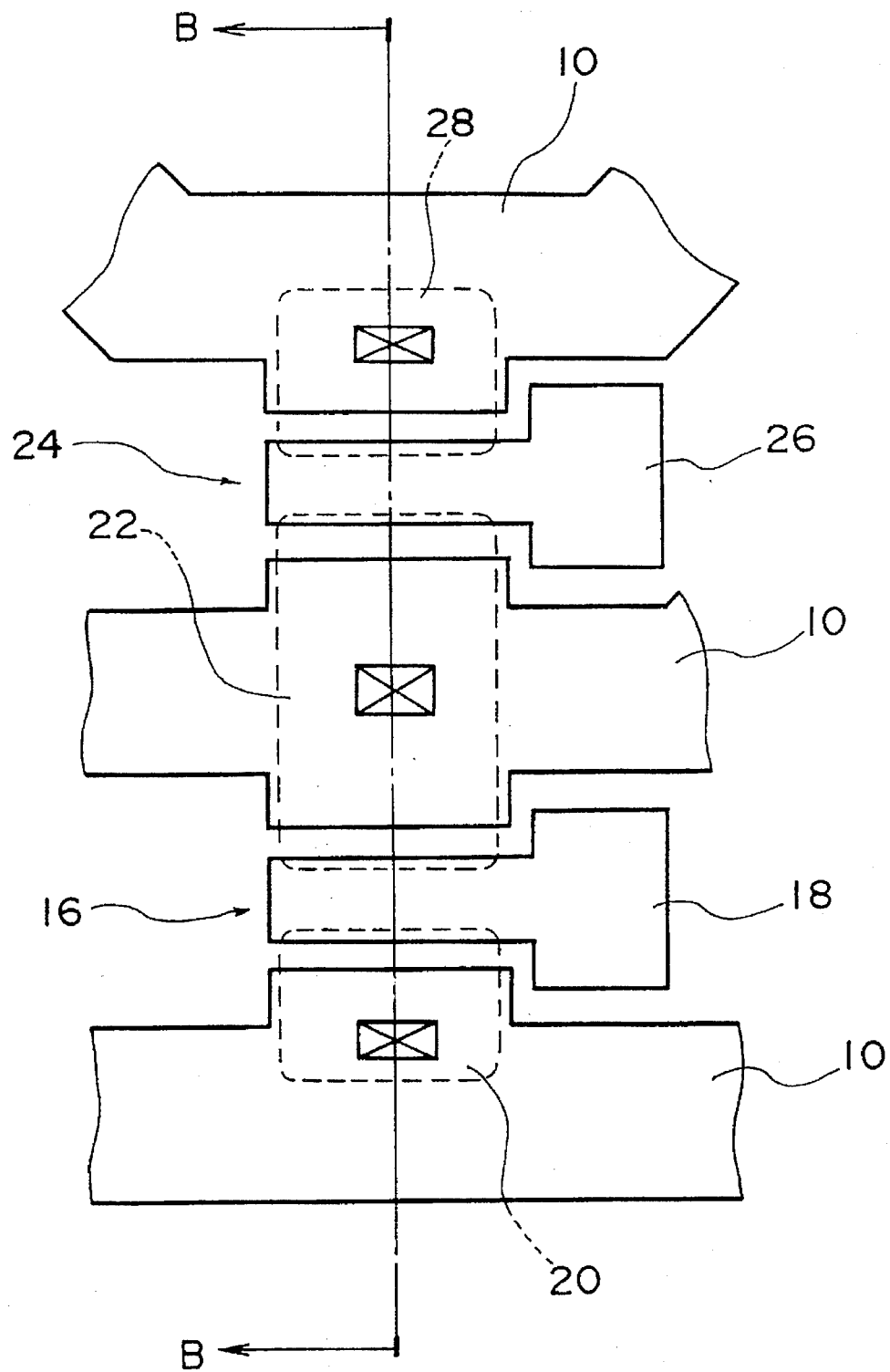
FIG. 2 is an enlarged fragmentary plan view of the variable inductance element shown in FIG. 1.

FIG. 1 is a plan view of a variable inductance element according to a first embodiment of this invention. FIG. 2 is an enlarged fragmentary plan view near the switch area of the variable inductance element in FIG. 1.

As indicated in the figures, the variable inductance element 100 comprises a spiral shaped inductor conductor 10 formed on an insulation layer 40 on the surface of an n type silicon (n-Si) substrate 42, and includes switches 16 and 24 for shorting the respective circumference portions of the inductor conductor 40.

The respective end portions of the inductor conductor 10 are wider than the spiral portions. One of these widened portions comprises an input/output terminal 12 and the other comprises an input/output terminal 14.

The inductor conductor 10 can be formed of metallic material such as aluminum or copper, or a semiconductor material such as polysilicon.

Switch 16 is for shorting the outermost and second from outermost circumference portions of the inductor conductor 10. Switch 16 comprises a T-shaped gate electrode 18 formed on the surface of the insulation layer 40, and two diffusion regions 20 and 22 formed so as to overlap portions of the gate electrode 18 near the surface of the n-Si substrate 42.

In the same manner as the above mentioned inductor conductor 10, the gate electrode 18 can be formed of metallic material such as aluminum or copper, or a semiconductor material such as polysilicon. The diffusion regions 20 and 22 are respectively formed by injecting p type impurities by thermal diffusion or ion implantation into portions of the n-Si substrate 42 and respectively correspond to the source and drain of a field effect transistor (FET).

The two diffusion regions 20 and 22 are disposed adjacent to each other astride the gate electrode 18. By applying a predetermined voltage to the gate electrode 18 relatively negative with respect to the substrate and diffusion regions 20 and 22, a p type channel is formed. A mutually conductive state is produced by this channel. Also, since one diffusion region 20 is connected to a portion of the outermost circumference of the inductor conductor 10, and the other diffusion region 22 is connected to a portion of the second from outermost circumference, when the conductive state is produced between these two diffusion regions 20 and 22, the outermost and second from outermost circumferences of the inductor conductor 10 are shorted at these portions.

In the same manner, switch 24 is for shorting the second from outermost and innermost circumferences of the inductor conductor 10. Switch 24 comprises a T-shaped gate electrode 26 formed on the surface of the insulation layer 40, and two diffusion regions 22 and 28 formed so as to overlap portions of the gate electrode 26 near the surface of the n-Si substrate 42.

In the same manner as diffusion regions 20 and 22, diffusion region 28 is formed by injecting p type impurities by thermal diffusion or ion implantation into a portion of the n-Si substrate 42. Diffusion region 22 and 28 respectively correspond to the source and drain of a field effect transistor.

The two diffusion regions 22 and 28 are disposed adjacent to each other astride the gate electrode 26. By applying a predetermined voltage to the gate electrode 26 relatively negative with respect to the substrate and diffusion regions 22 and 28, a p type channel is formed. A mutually conductive state is produced by this channel. Also, since one diffusion region 22 is connected to a portion of the second from outermost circumference of the inductor conductor 10, and the other diffusion region 22 is connected to a portion of the innermost circumference, when the conductive state is produced between these two diffusion regions 22 and 28, the outermost and second from outermost circumferences of the inductor conductor 10 are shorted at these portions.

Figure 3:
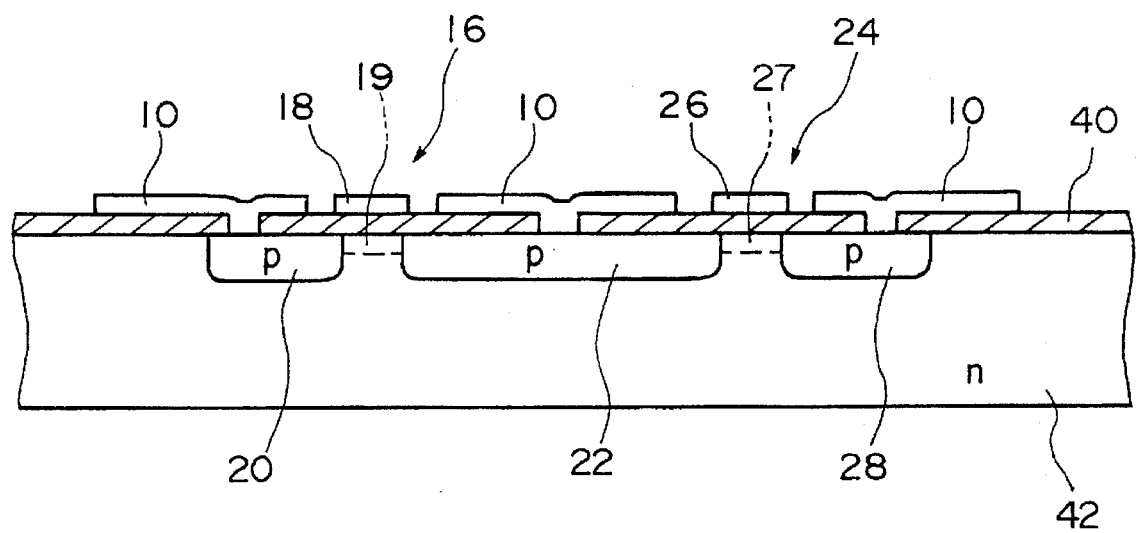
FIG. 3 is a cross-sectional view viewed along line B—B in FIG. 2.

FIG. 3 is a cross-sectional view viewed along line B—B in FIG. 2. As indicated in the figure, p type diffusion regions 20, 22 and 28 are formed at positions corresponding to parts of the respective circumference portions of the inductor conductor 10 near the surface of the n-Si substrate 42. Also, gate electrodes 18 and 26 are formed on the insulation layer 40 over regions between the respective diffusion regions 20, 22 and 28. These gate electrodes 18 and 26, insulation layer 40 and n-Si substrate 42 comprise MIS (metal-insulator-semiconductor) or MOS (metal-oxide-semiconductor) construction.

Consequently, in viewing the construction near one gate electrode 18, the two diffusion regions 20 and 22 respectively function as source or drain, thus comprising a field effect transistor, and this FET functions as the switch 16. When a predetermined negative voltage is applied to the gate electrode 18, a p type channel 19 is formed near the surface of the n-Si substrate 42 opposing the gate electrode 18. The channel 19 produces the conducting state between the two diffusion regions 20 and 22, thereby performing the predetermined switching operation.

In the same manner, in viewing the construction near the other gate electrode 26, the two diffusion regions 22 and 28 respectively function as source or drain, thus comprising a field effect transistor. This FET functions as the switch 24 for performing the predetermined switching operation.

In this manner, by applying a predetermined negative voltage to the gate electrode 18 for producing the switch 16 on state, the outermost and second from outermost circumference portions of the spiral shaped variable inductance element 100 indicated in FIG. 1 can be shorted at these portions. Consequently, when the predetermined negative voltage is applied to only gate electrode 18, a one turn portion at the outermost position of the spiral shaped inductor conductor 10 can be rendered ineffective and the overall variable inductance element 100 can be used as an approximately 1.5 turn element.

In the same manner, by applying a predetermined negative voltage to the gate electrode 26 for producing the switch 24 on state, the second from outermost and innermost circumference portions can be shorted. Consequently, when the predetermined negative voltage is applied only to gate electrode 26, a one turn portion at the essentially innermost position of the spiral shaped inductor conductor 10 can be rendered ineffective and the overall variable inductance element 100 can be used as an approximately 1.5 turn element. When only either one of the switches 16 or 24 is in the on state, although the function of an approximately 1.5 turn coil is produced, since the portion rendered ineffective differs, the overall inductance is not equal. Therefore, these modes should be selected according to the application.

Also, when a predetermined negative voltage is applied to both gate electrodes 18 and 26, thereby setting both switches 16 and 24 to the on state, since all three of the inductor conductor 10 circumference portions are mutually shorted, the outer portion from switch 16 and the inner portion from switch 26 can be combined to function as an approximately 0.5 turn coil, resulting in a very small inductance.

Consequently, by applying predetermined voltage to the gate electrodes 18 and 26 to set the on states of the switches 16 and 24 according to requirements, the overall element can be used as a 2.5 turn, 1.5 turn and 0.5 turn coil. By changing the turn quantity, the inductance can also be variably controlled.

When viewed externally, since the inductance between the two input/output terminals 12 and 14 can be variably controlled, by connecting the variable inductance element 100 to a portion of a circuit, then externally applying predetermined voltage to the gate electrodes 18 and 26, the inductance can be changed. The usage can also differ from a conventional fixed characteristic value coil. For example, in constructing a tuning circuit having a plurality of receiving frequencies determined beforehand, it is merely necessary to determine the inductor conductor 10 shorting positions for providing inductances corresponding to the plurality of receiving frequencies, then forming the gate electrode 18 and diffusion region 20 etc. at these positions.

The foregoing description of the present embodiment referred to examples of using a plurality of switches, but a plurality of switches is not essential. For example, only switch 24 in FIG. 1 can be retained and the other switches deleted.

Also, since the variable inductance element 100 of this embodiment can be manufactured on an n-Si substrate 42 by utilizing ordinary semiconductor manufacturing technology (especially MOS technology), down-sizing and mass production are rendered easy. In addition, other semiconductor components such as FETs, bipolar transistors etc. can also be formed on the same substrate and in such cases, the variable inductance element 100 of this embodiment can be formed in unitized manner with semiconductor components of an integrated circuit or other device on the same substrate. As a result, a device such as a switching regulator which conventionally used externally mounted coils can be produced in a form whereby the coils are built-in.

Also, since the variable inductance element 100 does not have moving parts such as a magnetic core, manufacturing and incorporation into a portion of a circuit is relatively easy.

SECOND EMBODIMENT

A variable inductance element according to a second embodiment of this invention is basically the same as the first embodiment and differs mainly in having a meander shaped inductor conductor 10. In the attached drawings, the same designations are used for those items which correspond to those of the first embodiment.

Figure 4:
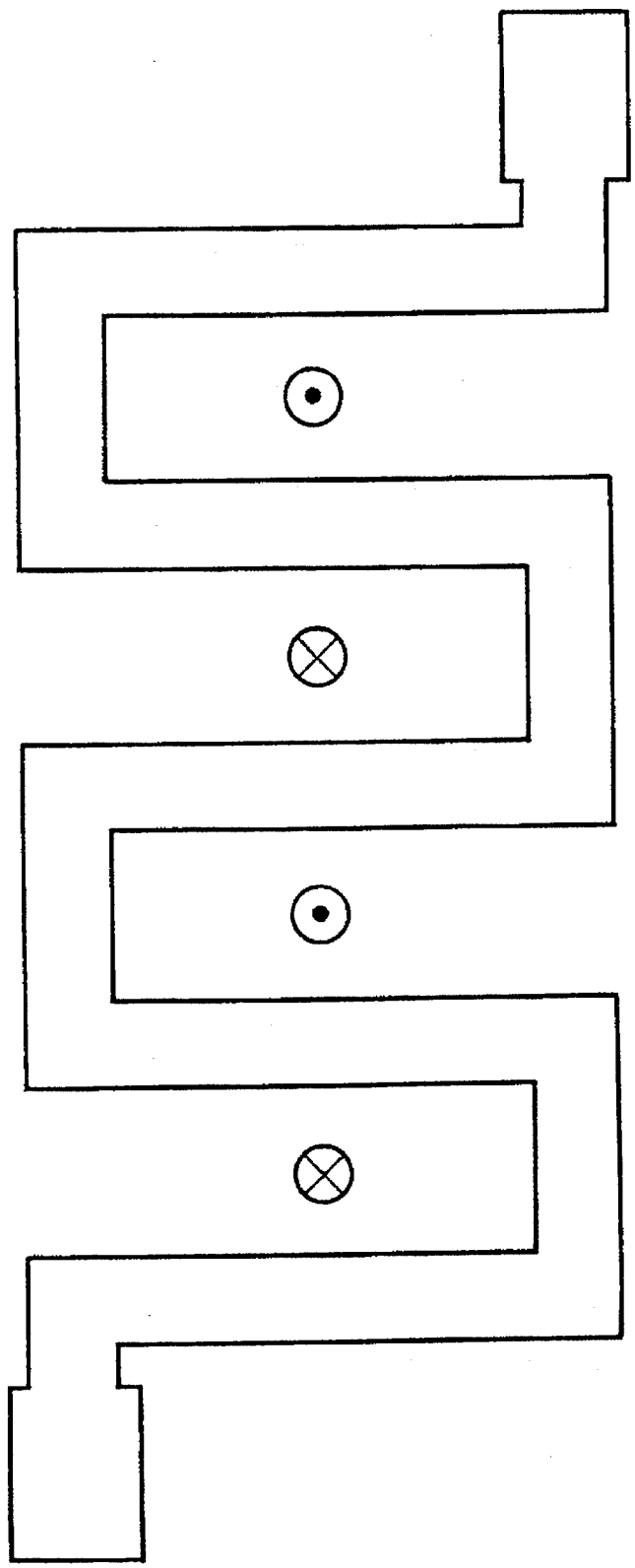
FIG. 4 shows the principle of a meander shaped inductor.

Following is a brief description of a meander shaped inductor conductor related to this embodiment. FIG. 4 indicates the principle of a meander shaped inductor. When current flows in a single direction in a meander shaped inductor conductor 10 having concave and convex bends, magnetic flux is produced so as to alternately reverse the direction in adjacent concave and convex bends (for example, perpendicularly upward from the figure near the locations indicated by circled dots in FIG. 4, and perpendicularly downward near the locations indicated by circled Xs), thereby resembling the state when ½ turn coils are connected in series. Consequently, an element having a meander shape such as indicated in FIG. 4 can be made to function as an inductor having an overall predetermined inductance.

Also, in the case of a spiral shaped inductor conductor, one of the inductor conductor ends is positioned at the center portion, and the other end is positioned at the circumference portion. In contrast, in the case of a meander shaped inductor conductor, since both ends of the inductor conductor are positioned at the peripheral portion, the arrangement is favorable for providing terminals and connecting to other circuit components.

Figure 5:
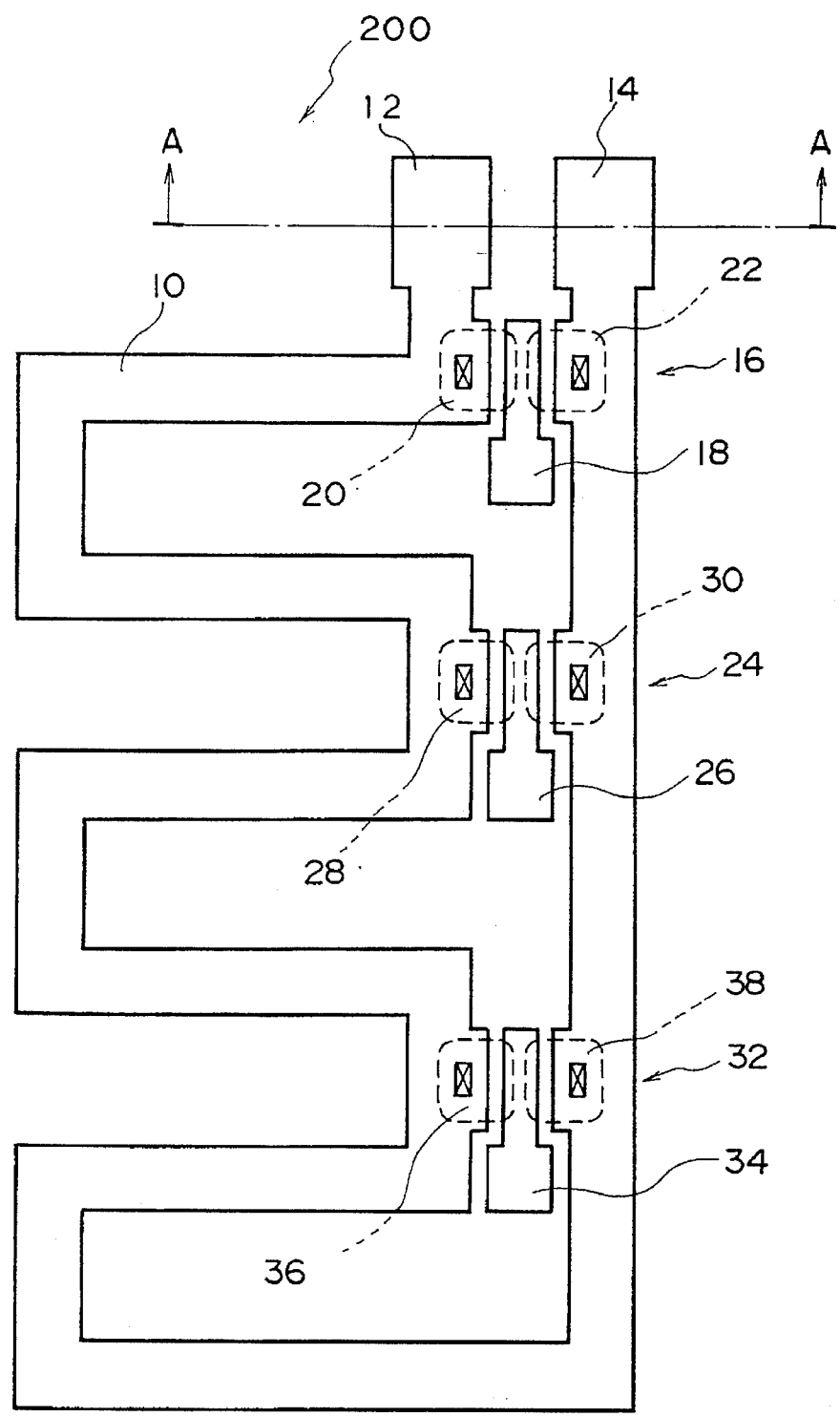
FIG. 5 is a plan view of a variable inductance element in accordance with a second embodiment of this invention.
Figure 6:
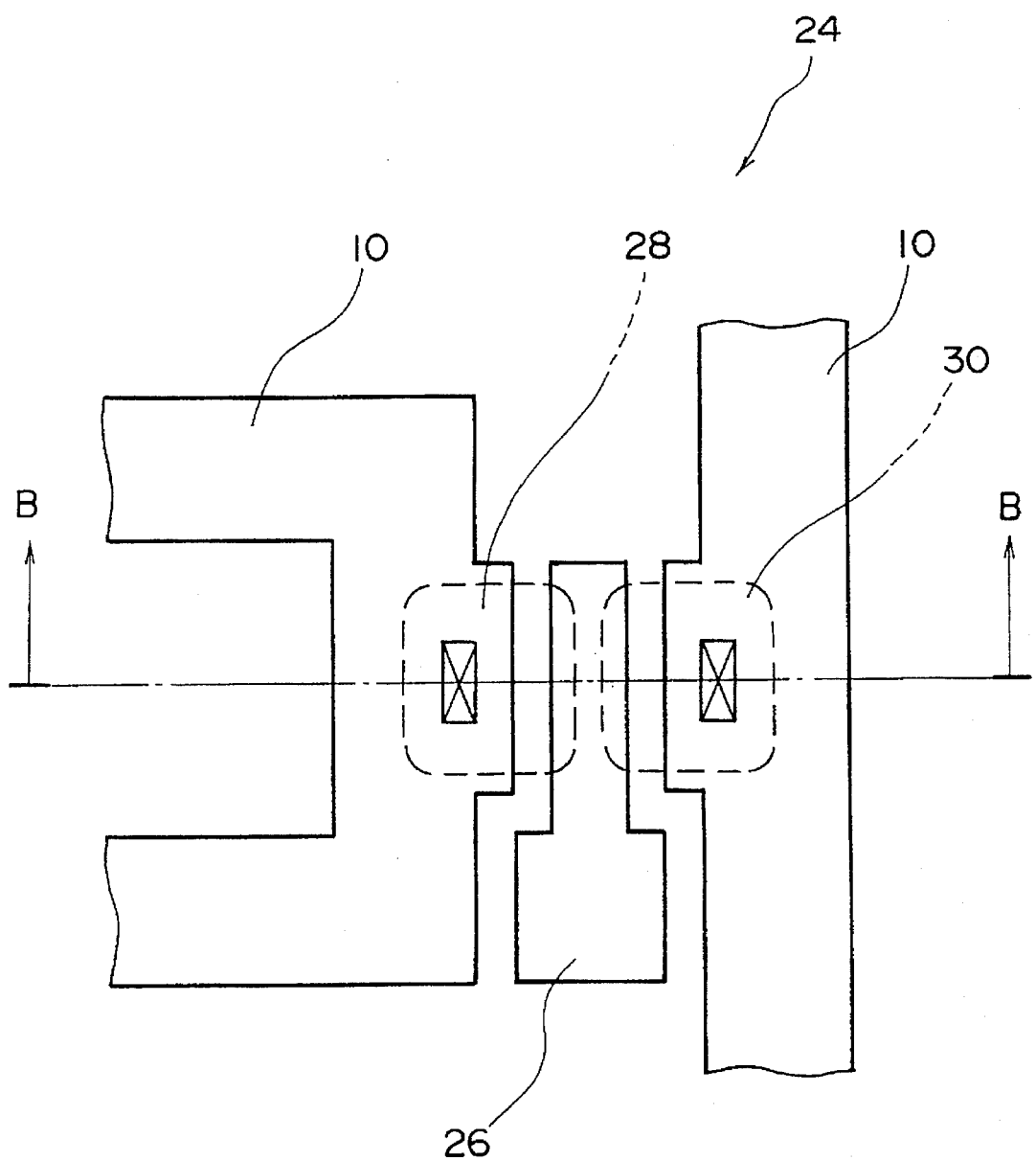
FIG. 6 is an enlarged fragmentary plan view of the variable inductance element shown in FIG. 5.

FIG. 5 is a plan view of a variable inductance element 200 according to a second embodiment of this invention. FIG. 6 is an enlarged segmentary plan view near the switch area of the variable inductance element in FIG. 5.

As indicated in the figures, the variable inductance element 200 comprises a meander shaped inductor conductor 10 formed on an insulation layer 40 on the surface of an n type silicon (n-Si) substrate 42, and includes switches 16, 24 and 32 for shorting the respective meander portions of the inductor conductor 10.

The respective end portions of the inductor conductor 10 are wider than the meander portions. One of these widened portions comprises input/output terminal 12 and the other comprises input/output terminal 14.

The meander shaped inductor conductor 10 can be formed of metallic material such as aluminum or copper, or a semiconductor material such as polysilicon.

Also, the inductor conductor 10 comprises a meander portion and a return portion. By forming this return portion, the above mentioned input/output terminals 12 and 14 are formed at adjacent positions, thereby rendering subsequent wiring and other work easy.

Switch 16 is for shorting the meander portion nearest the input/output terminal 12 and the return portion of the inductor conductor 10, and comprises a T-shaped gate electrode 18 formed on the surface of an insulation layer 40 and two diffusion regions 20 and 22 formed near the surface of the n-Si substrate 42 so as to overlap portions of the gate electrode 18.

In the same manner as the above mentioned meander shaped inductor conductor 10, the gate electrode 18 can be formed of metallic material such as aluminum or copper, or a semiconductor material such as polysilicon. The diffusion regions 20 and 22 are respectively formed by injecting p type impurities by thermal diffusion or ion implantation into portions of the n-Si substrate 42 and respectively correspond to the source and drain of a field effect transistor (FET).

The two diffusion regions 20 and 22 are disposed adjacent to each other astride the gate electrode 18. By applying a predetermined voltage to the gate electrode 18 relatively negative with respect to the substrate and diffusion regions 20 and 22, a p type channel is formed. A mutually conductive state is produced by this channel. Also, since one diffusion region 20 is connected to a portion of the inductor conductor 10 nearest the input/output terminal 12, and the other diffusion region 22 is connected to the return portion of the inductor conductor 10, when the conductive state is produced between these two diffusion regions 20 and 22, these portions of the inductor conductor 10 are shorted.

In the same manner, switch 24 is for shorting the second from closest meander portion to the input/output terminal 12 and the return portion of the inductor conductor 10. A T-shaped gate electrode 26 is formed on the surface of the insulation layer 40 and two diffusion regions 28 and 30 are formed so as to overlap portions of the gate electrode 26 near the surface of the n-Si substrate 42.

In the same manner as diffusion regions 20 and 22, diffusion regions 28 and 30 are respectively formed by injecting p type impurities by thermal diffusion or ion implantation into portions of the n-Si substrate 42 and respectively correspond to the source and drain of a field effect transistor.

The two diffusion regions 28 and 30 are disposed adjacent to each other astride the gate electrode 26. By applying a predetermined negative voltage to the gate electrode 26, a p type channel is formed and a mutually conductive state is produced by this channel. Also, since one diffusion region 28 is connected to the central meander portion and the other diffusion region 30 is connected to the return portion of the inductor conductor 10, when the conductive state is produced between these two diffusion regions 28 and 30, the central meander and return portions of the inductor conductor 10 are shorted.

As indicated in FIG. 5, the most distant switch 32 from the input/output terminal 12 comprises a gate electrode 34 and diffusion regions 36 and 38, and operates in exactly the same manner to control conduction between the most distant meander portion from the input/output terminal 12 and the return portion of the inductor conductor 10.

Figure 7:
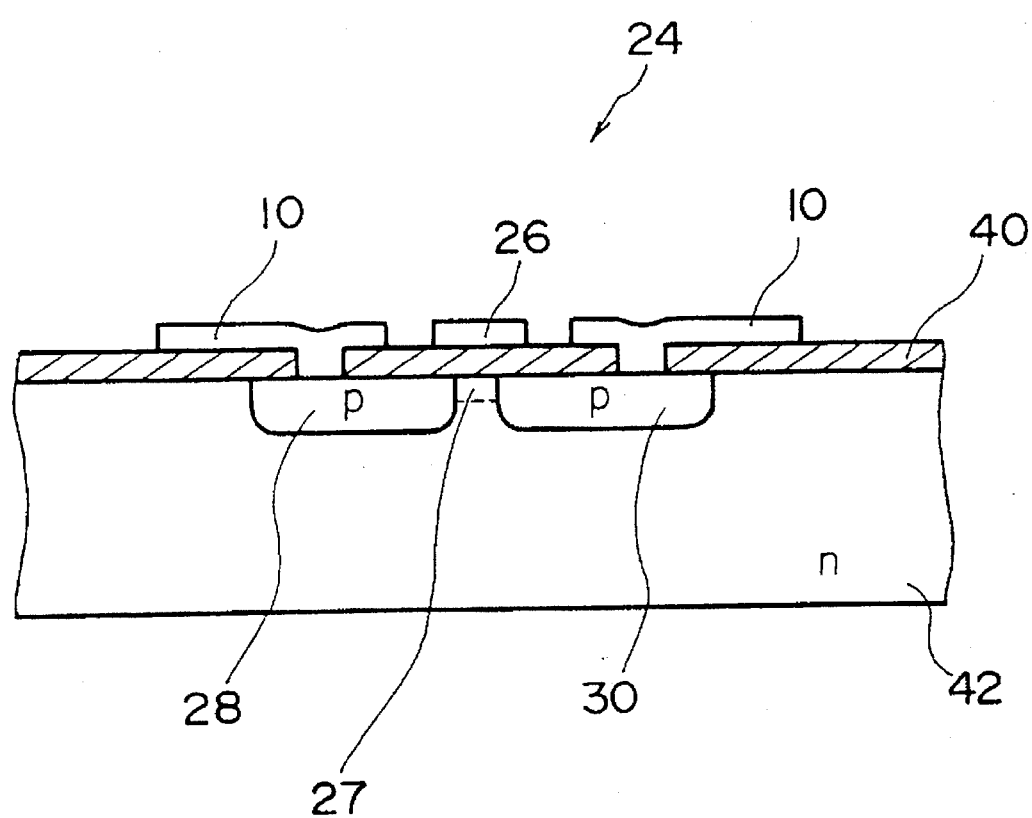
FIG. 7 is a cross-sectional view viewed along line B—B in FIG. 6.

FIG. 7 is a cross-sectional view viewed along line B—B in FIG. 6. As indicated in the figure, p type diffusion regions 28 and 30 are formed near the surface of the n-Si substrate 42 at positions corresponding to parts of the meander shaped inductor conductor 10. Also, a gate electrode 26 is formed on the insulation layer 40 over a region between the respective diffusion regions 28 and 30. The gate electrode 26, insulation layer 40 and n-Si substrate 42 comprise MIS (metal-insulator-semiconductor) or MOS (metal-oxide-semiconductor) construction.

Consequently, in viewing the construction near the gate electrode 26, the two diffusion regions 28 and 30 respectively function as source or drain, thus comprising a field effect transistor, and this FET functions as the switch 24. When a predetermined negative voltage is applied to the gate electrode 26, a p type channel 27 is formed near the surface of the n-Si substrate 42 opposing the gate electrode 26. The channel 27 produces the conducting state between the two diffusion regions 28 and 30, thereby performing the predetermined switching operation.

In the same manner, switches 16 and 32 also comprise field effect transistors and predetermined switching operations are performed by these FETs.

By applying a relatively negative voltage with respect to the substrate 42 and diffusion region 20 or 22 to the gate electrode 18 and producing the switch 16 on state, the meander portion and return portion of the inductor conductor 10 indicated in FIG. 5 can be shorted. This switching operation has the same practical effect as changing the length of the meander shaped inductor conductor 10 functioning as an inductor. In other words, when only switch 16 is on, the inductor conductor length is very short; when only switch 24 is on, the inductor conductor length is essentially one cycle of the meander shape; and when only switch 32 is on, the inductor conductor length is essentially two cycles of the meander shape. In practice, a small electrical resistance is introduced at the on state of each switch and the above mentioned ideal switching operation is not obtained. However, by operating each switch, the overall inductance of the variable inductance element 200 can be changed to a predetermined inductance.

Figure 8:
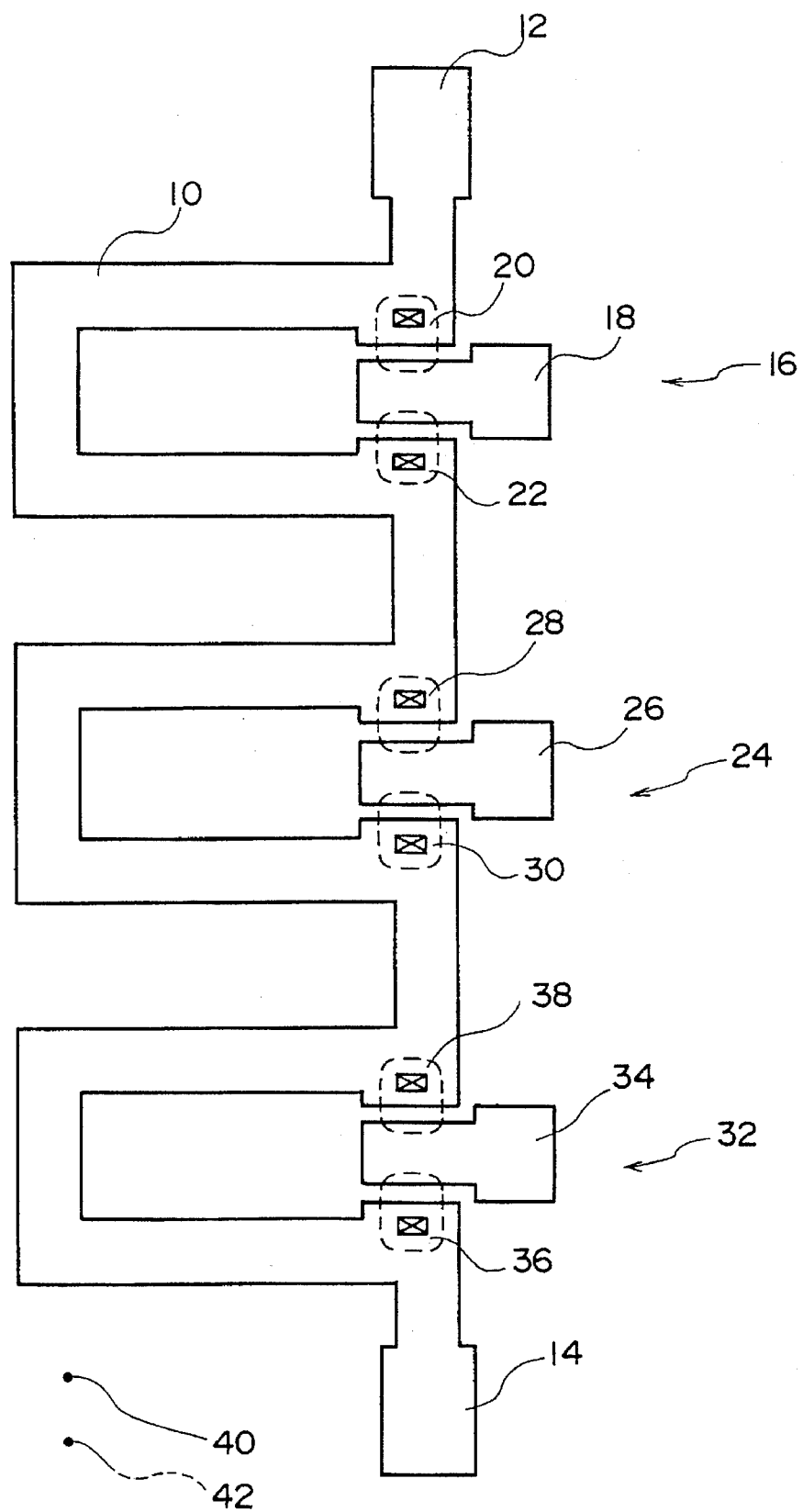
FIG. 8 shows an example of a variation of the variable inductance element of the second embodiment.

FIG. 8 indicates an example of a variation of the variable inductance element 200 according to the present embodiment. The variable inductance element 200 indicated in FIG. 5 comprises FET switches between meander portions of the inductor conductor 10 and portions of the linear shaped return portion. In the case of the present variation, FET switches are provided to enable changing the overall meander quantity by shorting the respective meander portions of the inductor conductor 10. Construction and other aspects of each switch are the same as the embodiment indicated in FIG. 5.

When the variable inductance elements of this embodiment indicated in FIGS. 5 and 8 are viewed externally, since the inductance between the two input/output terminals 12 and 14 can be variably controlled, by connecting the variable inductance element 200 to a portion of a circuit, then externally applying predetermined voltage to the gate electrodes 18, 26 and 34, the inductance can be changed. Therefore, the usage can also differ from a conventional fixed characteristic value coil. For example, in constructing a tuning circuit having a plurality of receiving frequencies determined beforehand, it is merely necessary to determine the inductor conductor 10 shorting positions for providing inductances corresponding to the plurality of receiving frequencies, then forming the gate electrode 18 and diffusion region 20 etc. at these positions.

The foregoing description of the present embodiment referred to examples of using a plurality of switches, but a plurality of switches is not essential. For example, only switch 24 in FIG. 5 can be retained and the other switches deleted.

Also, since the variable inductance element 200 of this embodiment can be manufactured on an n-Si substrate 42 by utilizing ordinary semiconductor manufacturing technology (especially MOS technology), down-sizing and mass production are rendered easy. In addition, other semiconductor components such as FETs, bipolar transistors etc. can also be formed on the same substrate and in such cases, the variable inductance element 200 of this embodiment can be formed in unitized manner with semiconductor components of an integrated circuit or other device on the same substrate. As a result, a device such as a switching regulator which conventionally used externally mounted coils can be produced in a form whereby the inductors are built-in.

Also, since the variable inductance element 200 does not have moving parts such as a magnetic core, manufacturing and incorporation into a portion of a circuit is relatively easy.

THIRD EMBODIMENT

Following is a description of a variable inductance element according to a third embodiment of this invention with reference to the attached drawings.

In the case of the variable inductance element 100 of the first embodiment, switches 16 and 24 comprising field effect transistors shorted portions of the spiral shaped inductor conductor 10, thereby variably controlling the inductance between the two input/output terminals 12 and 14. However, this shorting operation produces a single or a double closed loop. In contrast, the variable inductance element 300 of the third embodiment further comprises means for preventing formation of a closed loop during shorting.

Figure 9:
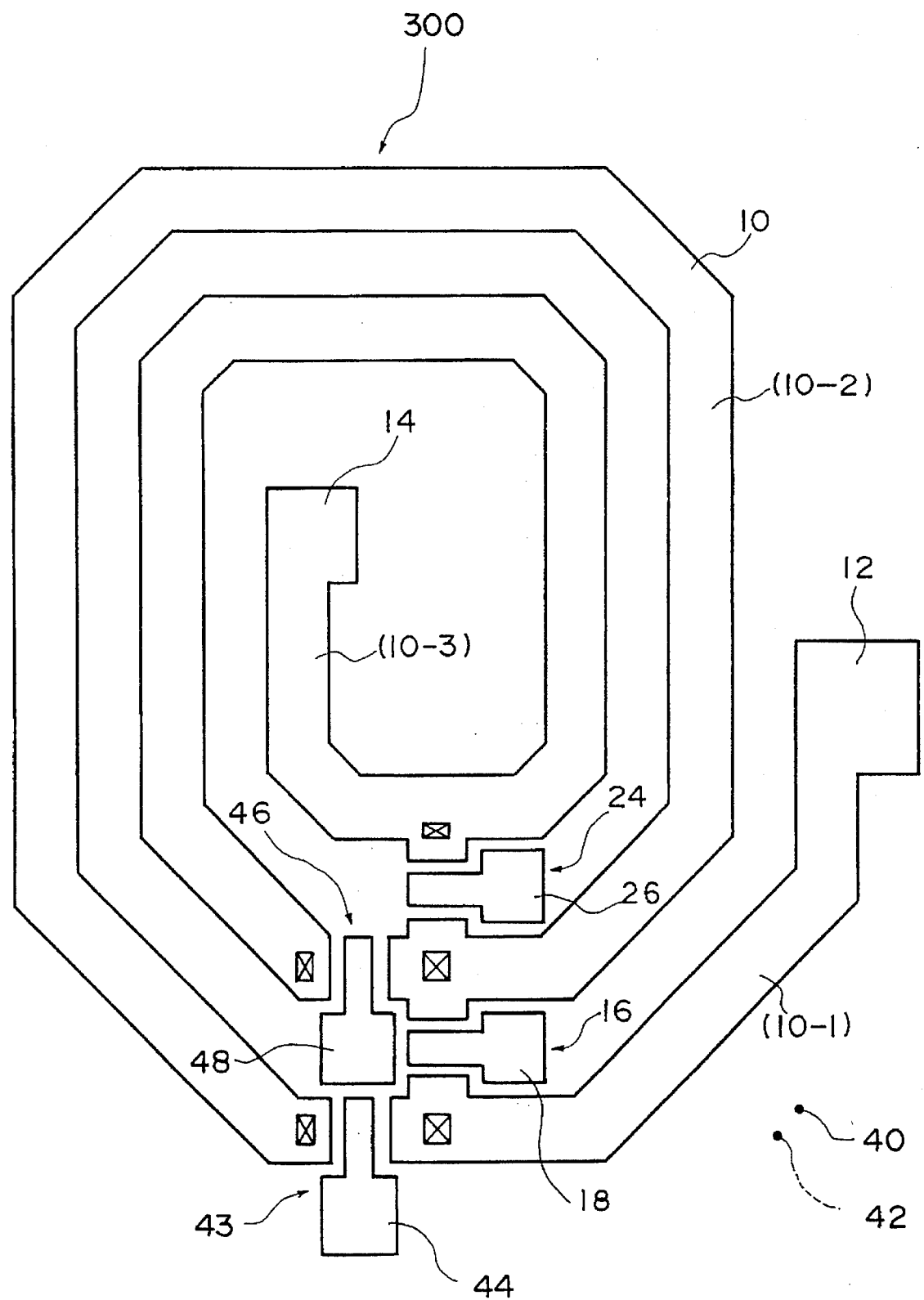
FIG. 9 is a plan view of a variable inductance element in accordance with a third embodiment of this invention.
Figure 10:
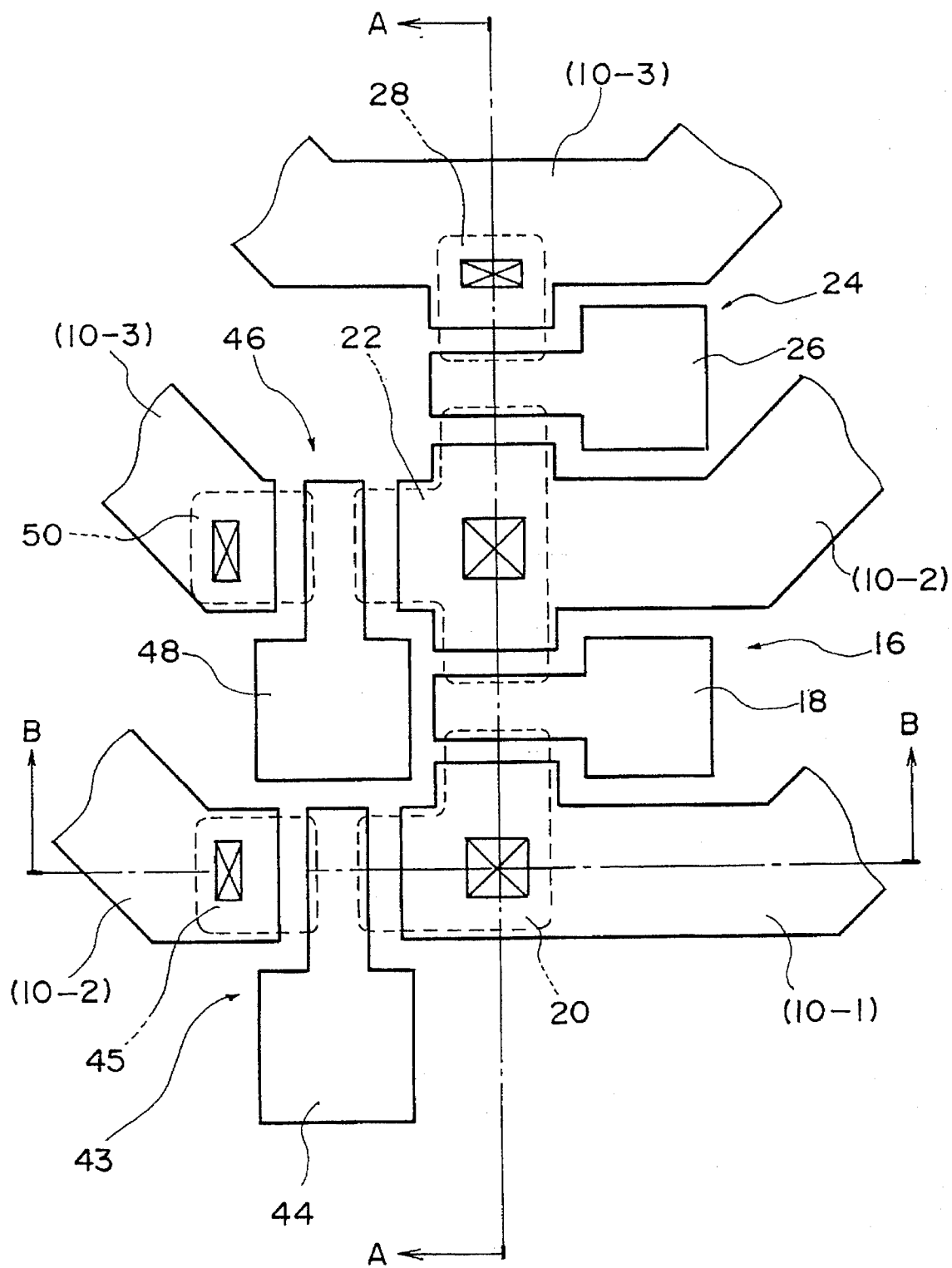
FIG. 10 is an enlarged fragmentary plan view of the variable inductance element shown in FIG. 9.

FIG. 9 is a plan view of a variable inductance element according to the third embodiment. FIG. 10 is an enlarged fragmentary plane view near the switch area in FIG. 9.

As indicated in the figures, a variable inductance element 300 according to this embodiment comprises an approximately 2.5 turn spiral shaped inductor conductor 10 formed on an insulation layer 40 on an n-Si substrate 42. The inductor conductor 10 differs from the first embodiment by being divided into three divided inductor conductors 10-1, 10-2 and 10-3 having an overall spiral shape.

Switch 43 is disposed between divided inductor conductors 10-1 and 10-2 for connecting these in series or separating them. In the same manner, switch 46 is disposed between divided inductor conductors 10-2 and 10-3 for connecting these in series or separating them. Consequently, when both switches 43 and 46 are on, the three divided inductor conductors 10-1, 10-2 and 10-3 function as a single inductor comprising an approximately 2.5 turn coil.

Switch 43 comprises a T-shaped gate electrode 44 formed between divided inductor conductors 10-1 and 10-2, and two diffusion regions 20 and 45 formed in portions of the n-Si substrate 42 surface and respectively connected to portions of the divided inductor conductors 10-1 and 10-2. Consequently, the switch 43 comprises a field effect transistor with the diffusion regions 20 and 45 respectively functioning as source or drain. When a predetermined negative voltage is applied to the gate electrode 44, a channel is formed between the two diffusion regions 20 and 45 to produce the switch 43 on state.

In the same manner switch 46 comprises a T-shaped gate electrode 48 formed between divided inductor conductors 10-2 and 10-3, and two diffusion regions 22 and 50 formed in portions of the n-Si substrate 42 surface and respectively connected to portions of the divided inductor conductors 10-2 and 10-3. Consequently, the switch 46 comprises a field effect transistor with the diffusion regions 22 and 50 respectively functioning as source or drain. When a predetermined negative voltage is applied to the gate electrode 48, a channel is formed between the two diffusion regions 22 and 50 to produce the switch 46 on state.

Figure 11A:
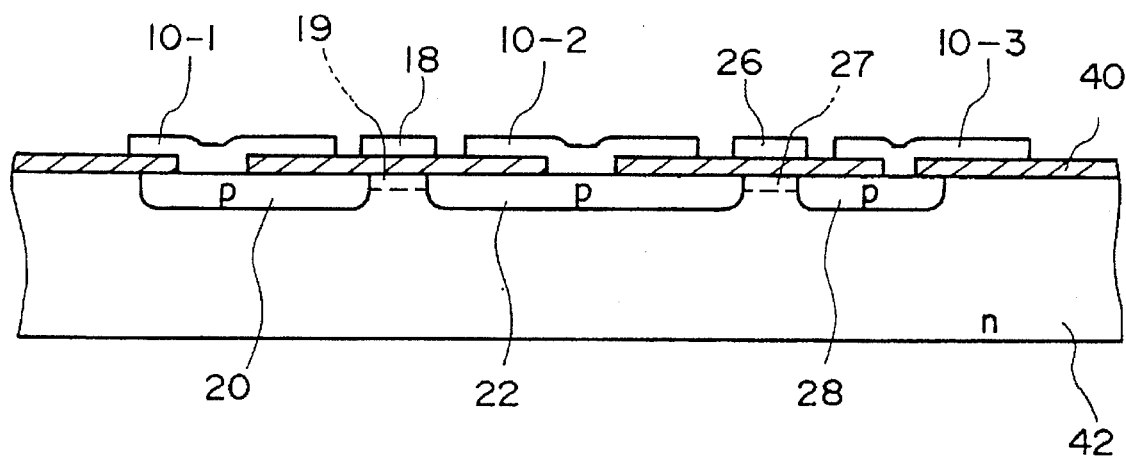
FIGS. 11A and 11B are cross-sectional views viewed respectively along lines A—A and B—B in FIG. 10.
Figure 11B:
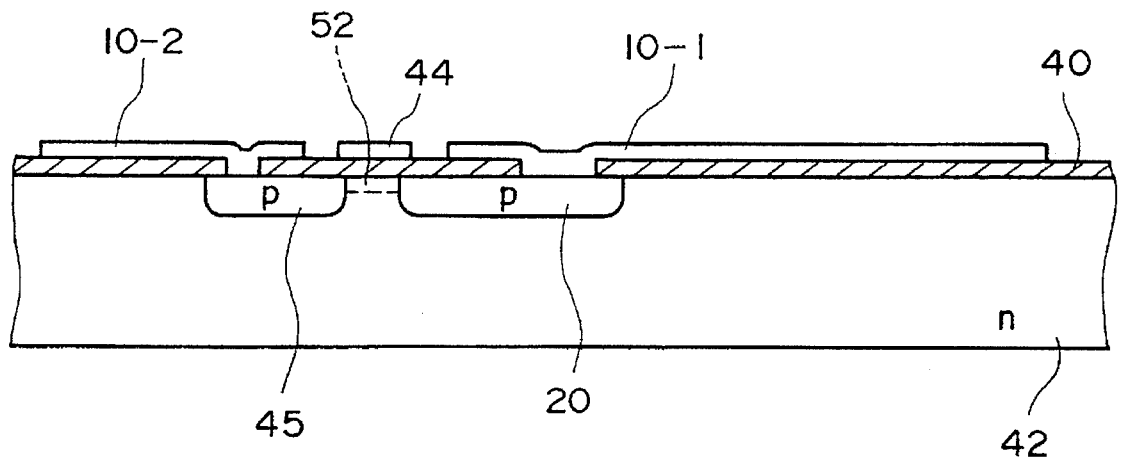

FIGS. 11A and 11B are fragmentary cross-sectional views of the variable inductance element 300. FIG. 11A is a cross-sectional view viewed along line A—A in FIG. 10 and basically does not differ from the cross-sectional construction of the first embodiment indicated in FIG. 3. FIG. 11B is a cross-sectional view viewed along line B—B in FIG. 10. When a predetermined negative voltage is applied to the gate electrode 48, a channel 52 is formed between the two diffusion regions 20 and 45.

In this manner, in addition to two switches 16 and 24 for shorting portions of the spiral shaped inductor conductor 10, switches 43 and 46 are provided for connecting in series or separating the respective divided inductor conductors 10-1, 10-2 and 10-3 comprising the spiral shaped inductor conductor 10.

When only switch 16 is in the on state, the outermost and second from outermost circumferences of the spiral shaped inductor conductor 10 are shorted to comprise an approximately 1.5 turn coil. Simultaneously, by setting switch 43 to the off state, one end of the divided inductor conductor 10-2 is cutoff, thereby preventing the divided inductor conductor 10-2 from forming a closed loop.

Similarly, when only switch 24 is in the on state, the second from outermost and innermost circumferences of the spiral shaped inductor conductor 10 are shorted to comprise an approximately 1.5 turn coil. Simultaneously, by setting switch 46 to the off state, one end of the divided inductor conductor 10-3 is cutoff, thereby preventing the divided inductor conductor 10-3 from forming a closed loop.

Although approximately 1.5 turn coils are comprised in both the above cases, depending on which divided inductor conductors are used, a slight difference also occurs in the inductance between the two input/output terminals 12 and 14. Also, when both switches 16 and 24 are set to the on state, each circumference of the spiral shaped inductor conductor 10 is mutually shorted, thereby comprising an approximately 0.5 turn coil between input/output terminals 12 and 14. In this case, by setting both switches 43 and 46 to the off state, closed loop formation by the divided inductor conductors 10-2 and 10-3 is prevented.

When both switches 43 and 46 are set to the on state and both switches 16 and 24 are set to the off state, the divided inductor conductors are respectively connected in series, thereby comprising an approximately 2.5 turn coil between the input/output terminals 12 and 14.

In this manner, by shorting portions of the spiral shaped inductor conductor 10 with switches 16 and 24, the overall turn quantity of the variable inductance element 300 can be changed between 2.5 and 0.5. As a result, the inductance between the input/output terminals 12 and 14 can be variably set.

Also, when shorting a portion of the spiral shaped inductor conductor 10, one end of the inductor conductor portion not used as a coil can be cut off by switches 43 and 46. As a result, unnecessary closed loop formation can be prevented, and unnecessary closed loop current accompanying magnetic flux generation can be prevented.

As in the above mentioned embodiments, the variable inductance element 300 has such advantages as manufacturing by utilizing ordinary semiconductor manufacturing technology, in which case down-sizing and mass production are enabled, and others.

The foregoing description of the present embodiment referred to an example of using a plurality of sets of switches, but having a plurality of sets of switches is not essential. For example, only a set of switches 24 and 46 in FIG. 9 can be retained and the other set of switches 16 and 43 deleted.

FOURTH EMBODIMENT

Following is a description of a variable inductance element according to a fourth embodiment of this invention with reference to the attached drawings.

A variable inductance element according to the fourth embodiment of this invention is basically the same as the third embodiment and differs mainly in having a meander shaped inductor conductor 10. In the attached drawings, the same designations are used for items which correspond to those of the third embodiment.

In the case of the variable inductance element 200 of the second embodiment, switches 16, 24 and 32 comprising field effect transistors shorted portions of the meander shaped inductor conductor 10, thereby variably controlling the inductance between the two input/output terminals 12 and 14. However, this shorting operation produces unnecessary closed loops. In contrast, the variable inductance element 400 of the fourth embodiment further comprises means for preventing formation of a closed loop during shorting.

Figure 12:
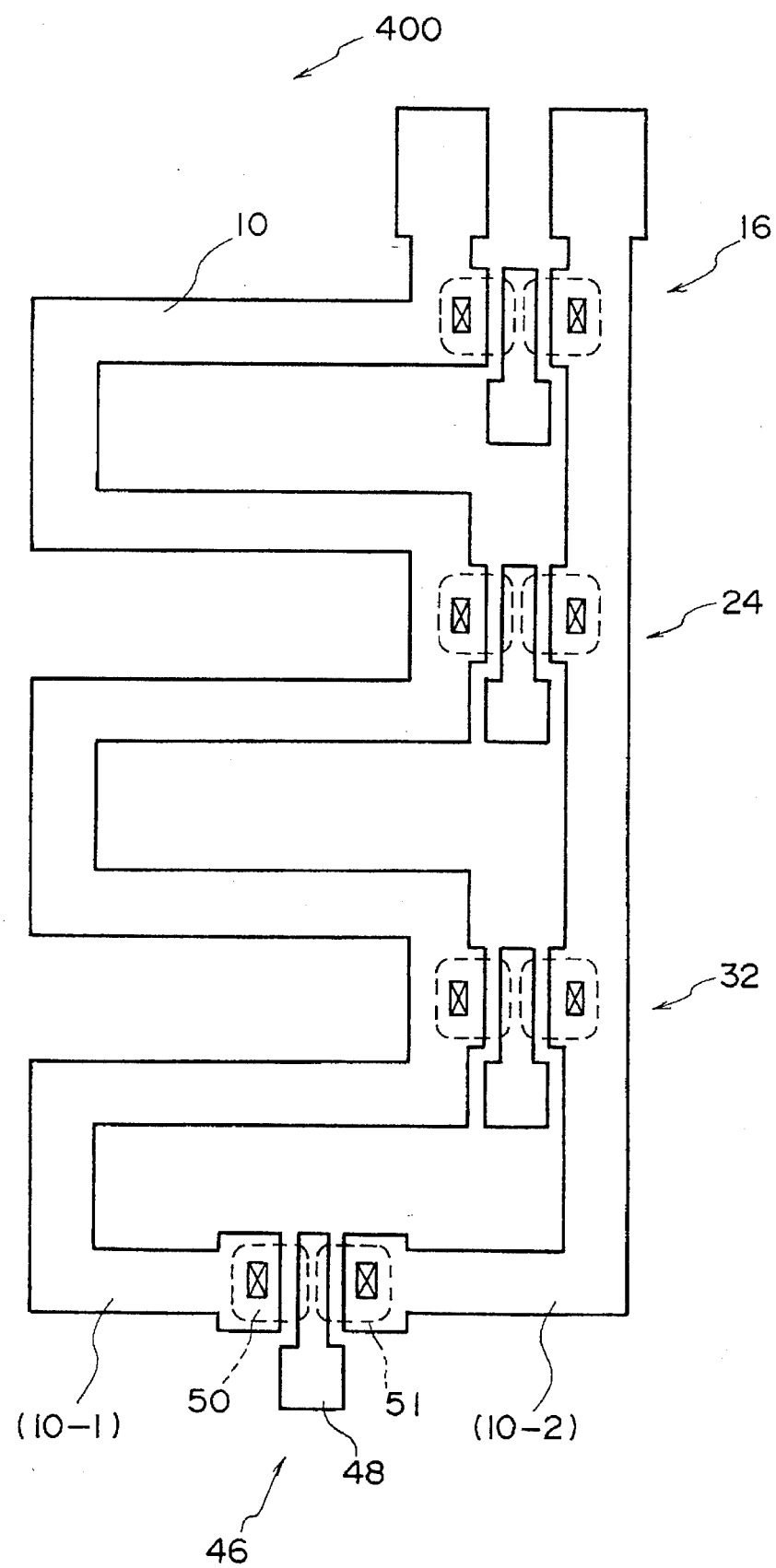
FIG. 12 is a plan view of a variable inductance element in accordance with a fourth embodiment of this invention.
Figure 13:
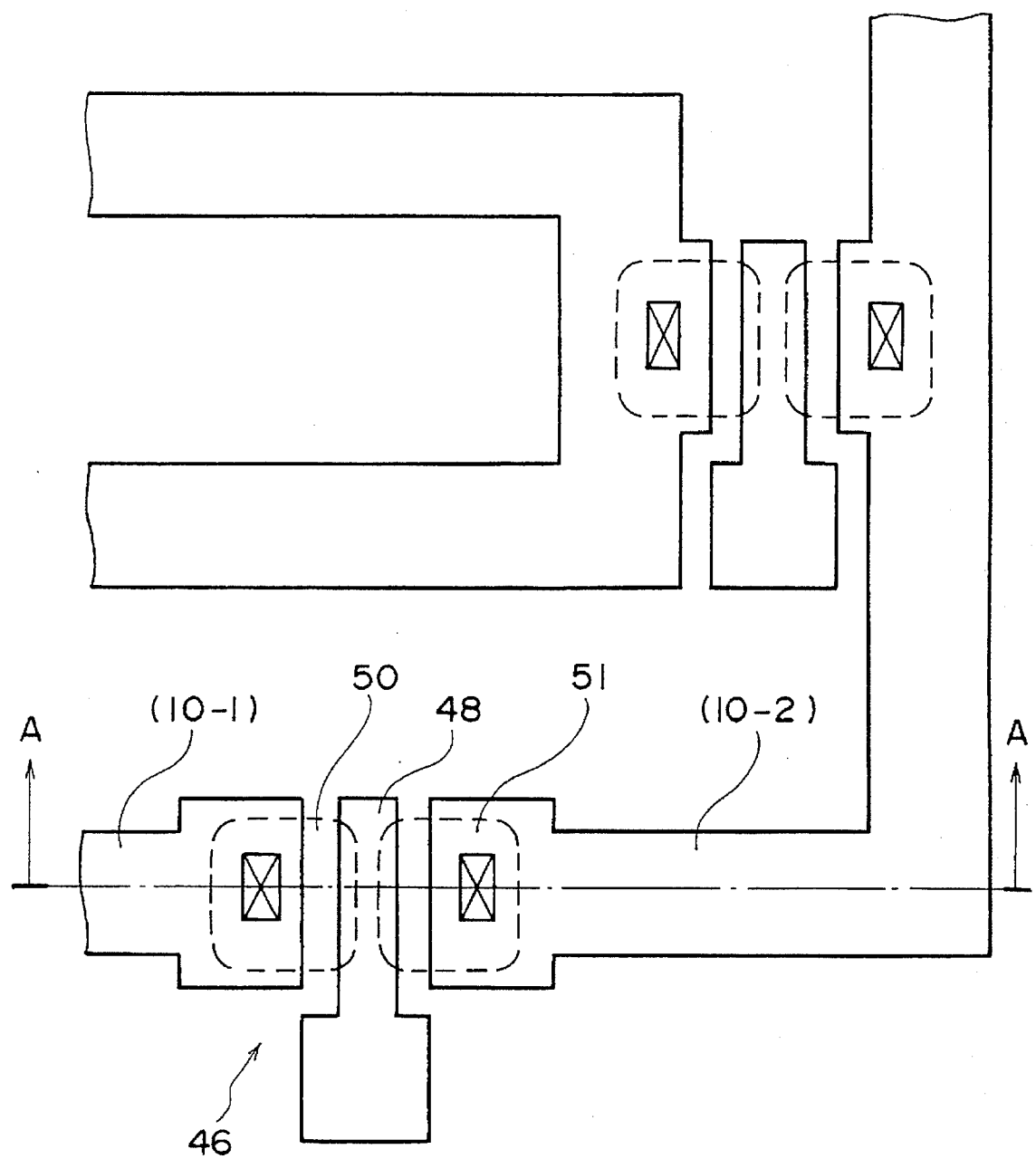
FIG. 13 is an enlarged fragmentary plan view of the variable inductance element shown in FIG. 12.

FIG. 12 is a plan view of a variable inductance element according to the fourth embodiment. FIG. 13 is an enlarged fragmentary plan view near the switch area in FIG. 12.

As indicated in the figures, a variable inductance element 400 according to this embodiment comprises a meander shaped inductor conductor 10 formed on an insulation layer 40 on an n-Si substrate 42. The meander shaped inductor conductor 10 differs from the second embodiment by comprising a meander shaped divided conductor 10-1 and a linear shaped return inductor conductor 10-2.

A switch 46 is disposed between the meander shaped divided inductor conductor 10-1 and the return divided inductor conductor 10-2 for connecting these in series or separating them. Consequently, when the switch 46 is in the on state, the overall meander shaped inductor conductor 10 functions as a single inductor.

Switch 46 comprises a T-shaped gate electrode 48 formed between the meander shaped divided conductor 10-1 and return divided inductor conductor 10-2, and two diffusion regions 50 and 51 formed in portions of the n-Si substrate 42 surface and respectively connected to portions of the two divided inductor conductors 10-1 and 10-2. Consequently, the switch 46 comprises a field effect transistor with the diffusion regions 50 and 51 respectively functioning as source or drain. When a predetermined negative voltage is applied to the gate electrode 48, a channel is formed between the two diffusion regions 50 and 51 to produce the switch 46 on state.

Figure 14:
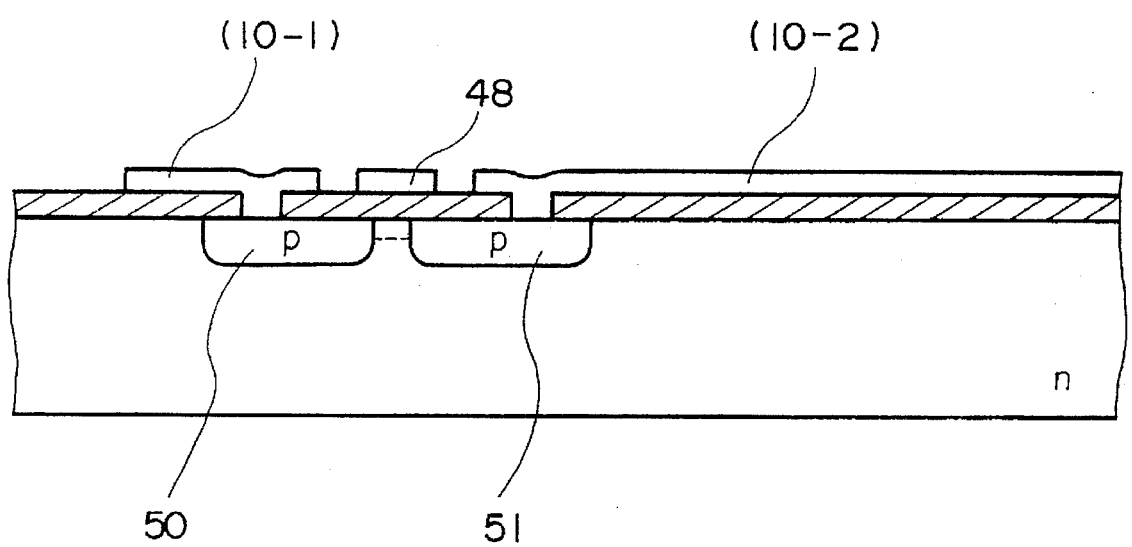
FIG. 14 is a cross-sectional view viewed along line A—A in FIG. 13.

FIG. 14 is a cross-sectional view viewed along line A—A in FIG. 13 and basically does not differ from the cross-sectional construction of the second embodiment indicated in FIG. 7.

In this manner, in addition to switches 16, 24 and 32 for shorting portions of the meander shaped inductor conductor 10, switch 46 is provided for connecting in series or separating the respective two divided inductor conductors 10-1 and 10-2 comprising the spiral shaped inductor conductor 10.

When any one of the switches 16, 24 or 32 is in the on state, the meander shaped divided inductor conductor 10-1 and the return divided inductor conductor 10-2 of the inductor conductor 10 are shorted at respective portions, thereby comprising an inductor with reduced inductance between the input/output terminals 12 and 14. At the same time, by turning off switch 46, the connection is cutoff between the two divided inductor conductors 10-1 and 10-2 of the meander shaped inductor conductor 10, thereby preventing formation of a closed loop by the portion not used as an inductor. As a result, unnecessary closed loop current accompanying magnetic flux generation can be prevented.

When setting all the switches 16, 24 and 32 to the off state and using the entire inductor conductor 10 as an inductor, switch 46 should be set to the on state for connecting in series the two divided inductor conductors 10-1 and 10-2 comprising the inductor conductor 10.

In this manner, by shorting portions of the meander shaped inductor conductor 10 with switches 16, 24 and 32, the inductance between the two input/output terminals 12 and 14 can be variably set, while unnecessary closed loop generation can be prevented.

As in the above mentioned embodiments, the variable inductance element 400 has such advantages of as manufacturing by utilizing ordinary semiconductor manufacturing technology, in which case down-sizing and mass production are enabled, and others.

The foregoing description of the present embodiment referred to an example of using a plurality of switches, but a plurality of switches is not essential. For example, only switch 24 in FIG. 12 can be retained and the other switches 16 and 32 deleted.

FIFTH EMBODIMENT

Following is a description of a variable inductance element according to a fifth embodiment of this invention with reference to the attached drawings.

In the case of the above described variable inductance elements 100 and 300 of the first and third embodiments, the spiral shaped inductor conductor 10 turn quantity was changed by shorting the respective circumference portions. In contrast, in the case of the variable inductance element 500 of the present embodiment, the turn quantity is changed without shorting the circumference portions.

Figure 15:
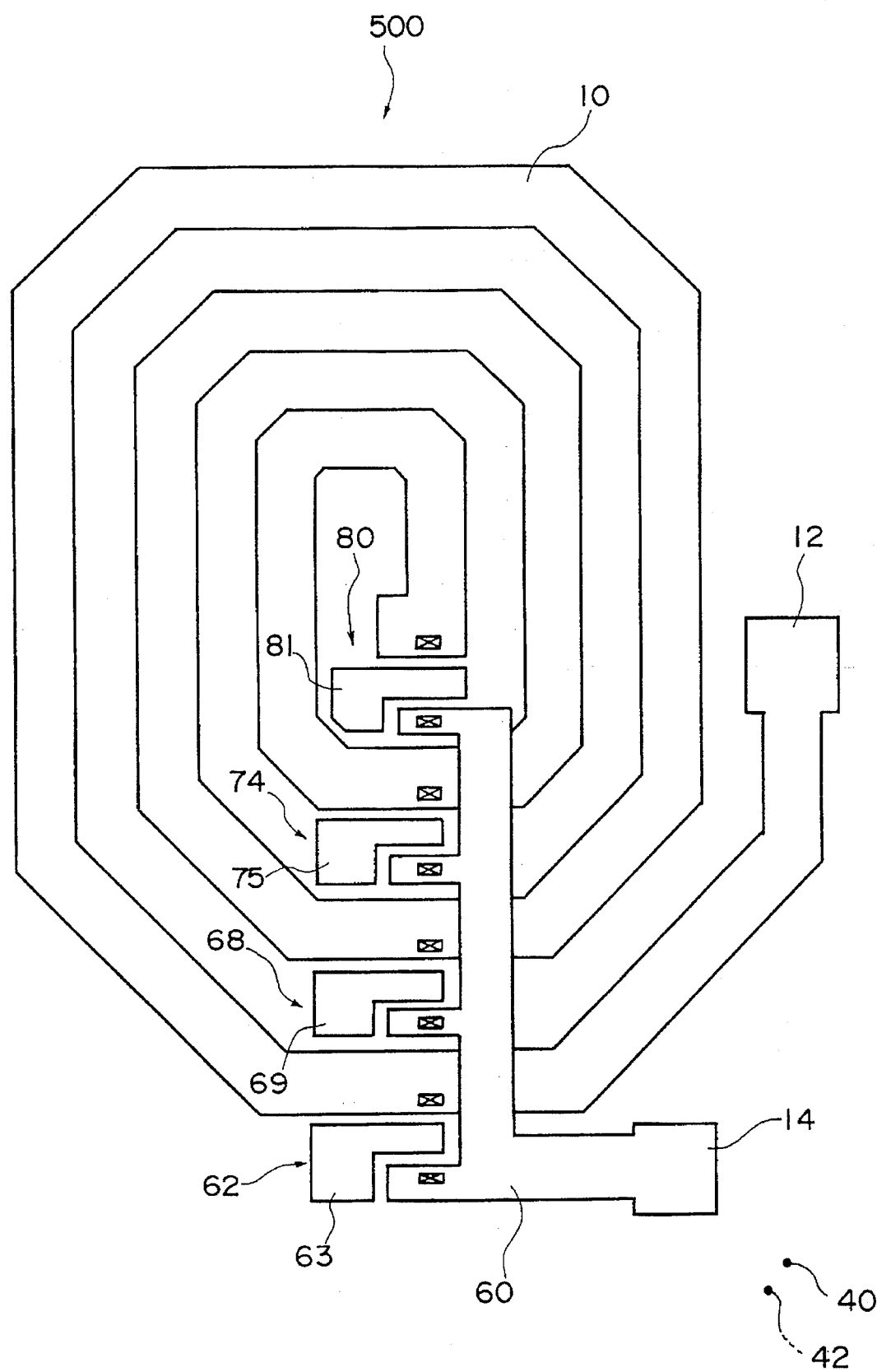
FIG. 15 is a plan view of a variable inductance element in accordance with a fifth embodiment of this invention.
Figure 16:
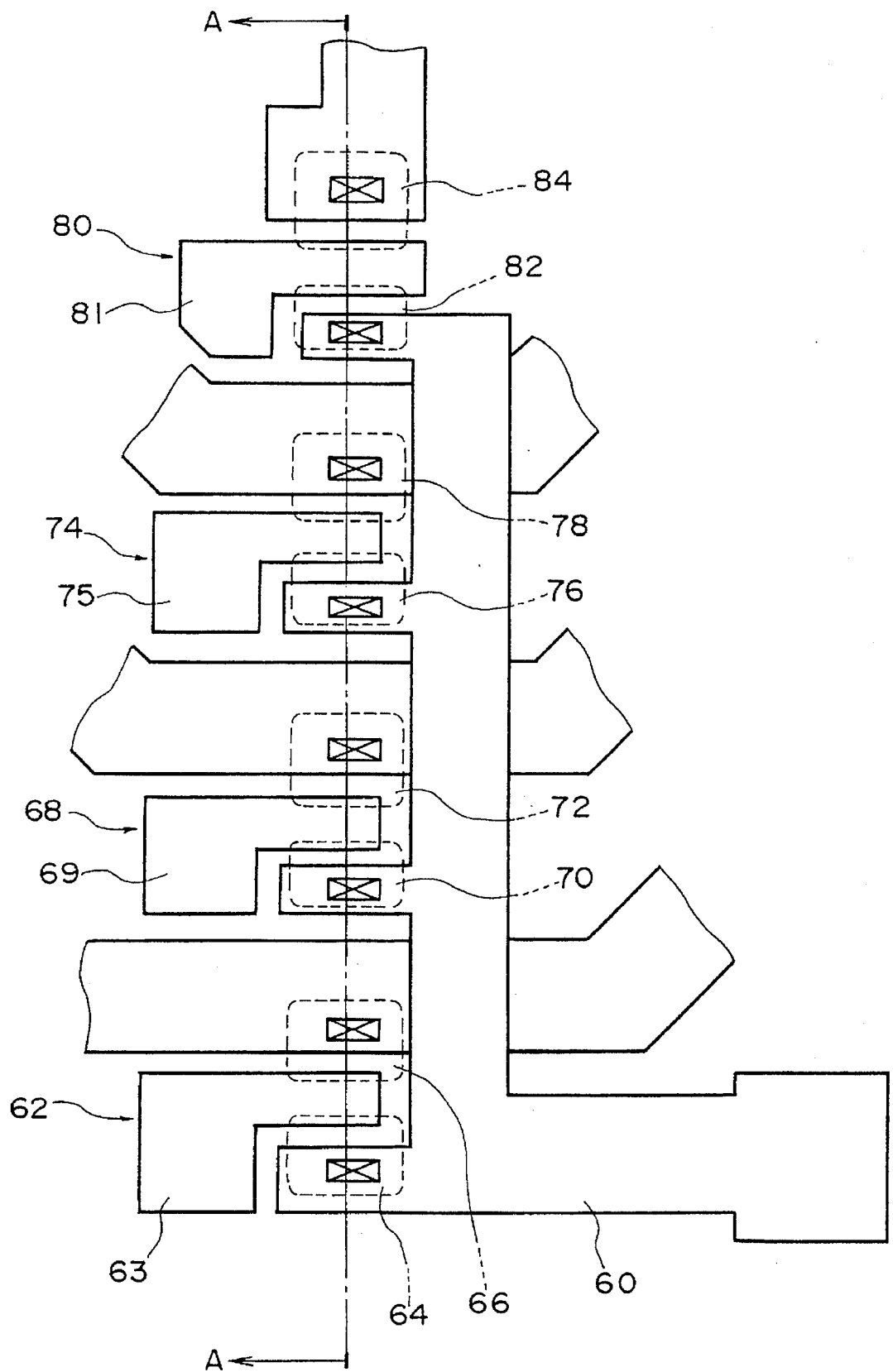
FIG. 16 is an enlarged fragmentary plan view of the variable inductance element shown in FIG. 15.

FIG. 15 is a plan view of a variable inductance element according to the fifth embodiment. FIG. 16 is an enlarged fragmentary plan view near the switches of the variable inductance element shown in FIG. 15.

As indicated in the figures, the variable inductance element 500 comprises a spiral shaped inductor conductor 10 and a linear shape conductor 60 formed on an insulation layer 40 on the surface of an n-Si substrate 42, and includes four switches 62, 68, 74 and 80 for connecting the inductor conductor 10 and linear shape conductor 60.

The inductor conductor 10 has an approximately three turn spiral shape and one outer circumference end comprises an input/output terminal 12 having a wide shape. The linear shape conductor 60 comprises a linear portion having a plurality of projecting members. This linear portion is disposed on an insulation layer so as to be orthogonal to the respective circumference portions of the spiral shaped inductor conductor 10 below. One end (near to the spiral shaped inductor conductor 10 outer circumference) of this linear shape conductor 60 comprises an input/output terminal 14 having a wide shape.

Switch 62 electrically connects the outermost circumference of the spiral shaped inductor conductor 10 and a portion of the linear shape conductor 60. The switch 62 comprises an L-shaped gate electrode 63 formed on the surface of the insulation layer 40 and two diffusion regions 64 and 66 formed near the surface of the n-Si substrate 42 so as to overlap portions of the gate electrode 63. When a predetermined negative voltage is applied to the gate electrode 63, a p channel is formed between the two diffusion regions 64 and 66, and the switch 62 is set to the on state. As a result, the outermost circumference of the spiral shaped inductor conductor 10 and the linear shape conductor 60 are mutually connected.

In the same manner, switch 68 electrically connects the second from outermost circumference of the spiral shaped inductor conductor 10 and a portion of the linear shape conductor 60. The switch 68 comprises an L-shaped gate electrode 69 formed on the surface of the insulation layer 40 and two diffusion regions 70 and 72 formed near the surface of the n-Si substrate 42 so as to overlap portions of the gate electrode 69. When a predetermined negative voltage is applied to the gate electrode 69, the switch 68 on state is produced, thereby mutually connecting the second from outermost circumference of the spiral shaped inductor conductor 10 and the linear shape conductor 60.

Switch 74 electrically connects the third from outermost circumference of the spiral shaped inductor conductor 10 and a portion of the linear shape conductor 60. The switch 74 comprises an L-shaped gate electrode 75 formed on the surface of the insulation layer 40 and two diffusion regions 76 and 78 formed near the surface of the n-Si substrate 42 so as to overlap portions of the gate electrode 75. When a predetermined negative voltage is applied to the gate electrode 75, the switch 74 on state is produced, thereby mutually connecting the third from outermost circumference of the spiral shaped inductor conductor 10 and the linear shape conductor 60.

Switch 80 electrically connects the inner end portion of the inductor conductor 10 and a portion of the linear shape conductor 60. The switch 80 comprises an L-shaped gate electrode 81 formed on the surface of the insulation layer 40 and two diffusion regions 82 and 84 formed near the surface of the n-Si substrate 42 so as to overlap portions of the gate electrode 81. When a predetermined negative voltage is applied to the gate electrode 81, the switch 80 on state is produced, thereby mutually connecting the inner end portion of the spiral shaped inductor conductor 10 and the linear shape conductor 60.

Figure 17:
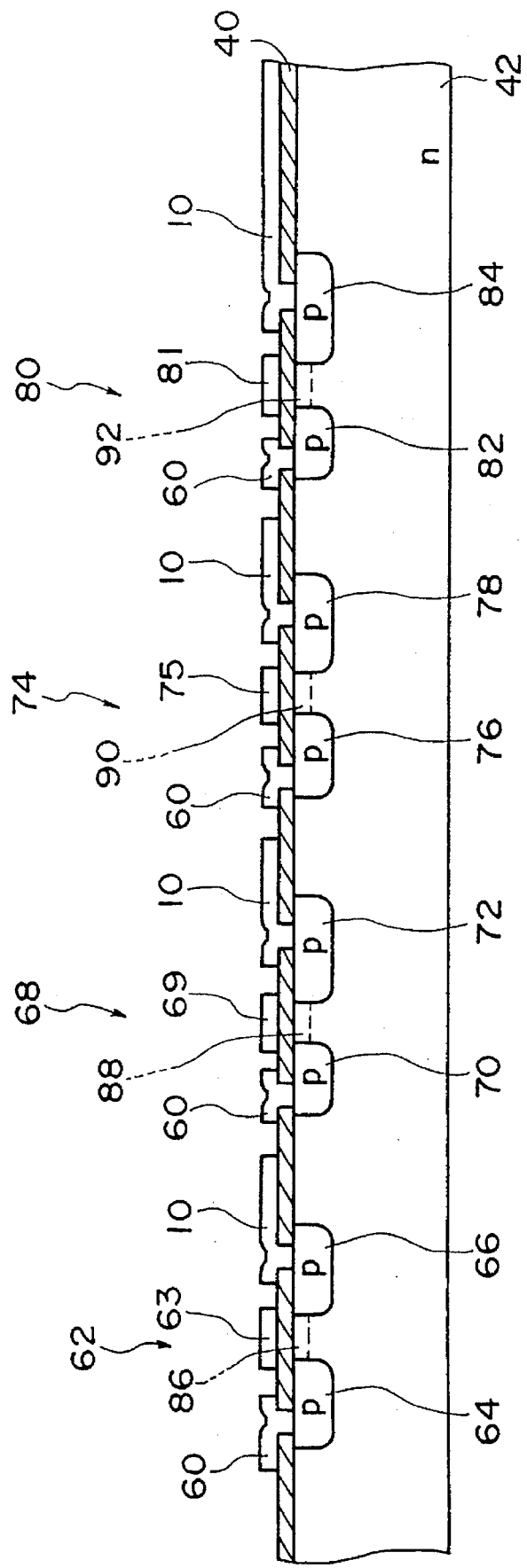
FIG. 17 is a cross-sectional view viewed along line A—A in FIG. 16.

FIG. 17 is a cross-sectional view viewed along line A—A in FIG. 16. Switch 62 in the figure comprises two diffusion regions 64 and 66 formed near the surface of the n-Si substrate 42 astride the gate electrode 63 on the insulation layer 40. When a predetermined negative voltage is applied to the gate electrode 63, a channel 86 is formed between the two diffusion regions 64 and 66, and the predetermined switching operation is performed.

In the same manner, switch 68 comprises two diffusion regions 70 and 72 formed near the surface of the n-Si substrate 42 astride the gate electrode 69 on the insulation layer 40. When a predetermined negative voltage is applied to the gate electrode 69, a channel 88 is formed between the two diffusion regions 70 and 72, and the predetermined switching operation is performed.

Switch 74 comprises two diffusion regions 76 and 78 formed near the surface of the n-Si substrate 42 astride the gate electrode 75 on the insulation layer 40. When a predetermined negative voltage is applied to the gate electrode 75, a channel 90 is formed between the two diffusion regions 76 and 78, and the predetermined switching operation is performed.

Switch 80 comprises two diffusion regions 82 and 84 formed near the surface of the n-Si substrate 42 astride the gate electrode 81 on the insulation layer 40. When a predetermined negative voltage is applied to the gate electrode 81, a channel 92 is formed between the two diffusion regions 82 and 84, and the predetermined switching operation is performed.

In this manner, when only switch 80 is in the on state, the variable inductance element 500 of this embodiment effectively functions as an approximately three turn coil between the two input/output terminals 12 and 14; when only switch 74 is on, the function is an approximately two turn coil; and when only switch 68 is on, the function is an approximately one turn coil. In addition, when only switch 62 is on, a coil having a circular shape is not formed and an element having a very small inductance is comprised. Consequently, by changing the gate electrode for applying the predetermined voltage, the number of coil turns connected between the two input/output terminals 12 and 14 can be changed and as a result, the inductance can also be variably set.

The variable inductance element 500 also includes such advantages of the above mentioned embodiments as manufacturing by utilizing ordinary semiconductor manufacturing technology, in which case down-sizing and mass production are enabled, and others.

SIXTH EMBODIMENT

Following is a description of a variable inductance element according to a sixth embodiment of this invention with reference to the attached drawings.

In the case of the above described variable inductance elements 200 and 400 of the second and fourth embodiments, inductance was changed by shorting a portion of the meander shaped inductor conductor 10. In contrast, in the case of the variable inductance element 600 of the present embodiment, the turn quantity is changed without shorting the meander portions.

Figure 18:
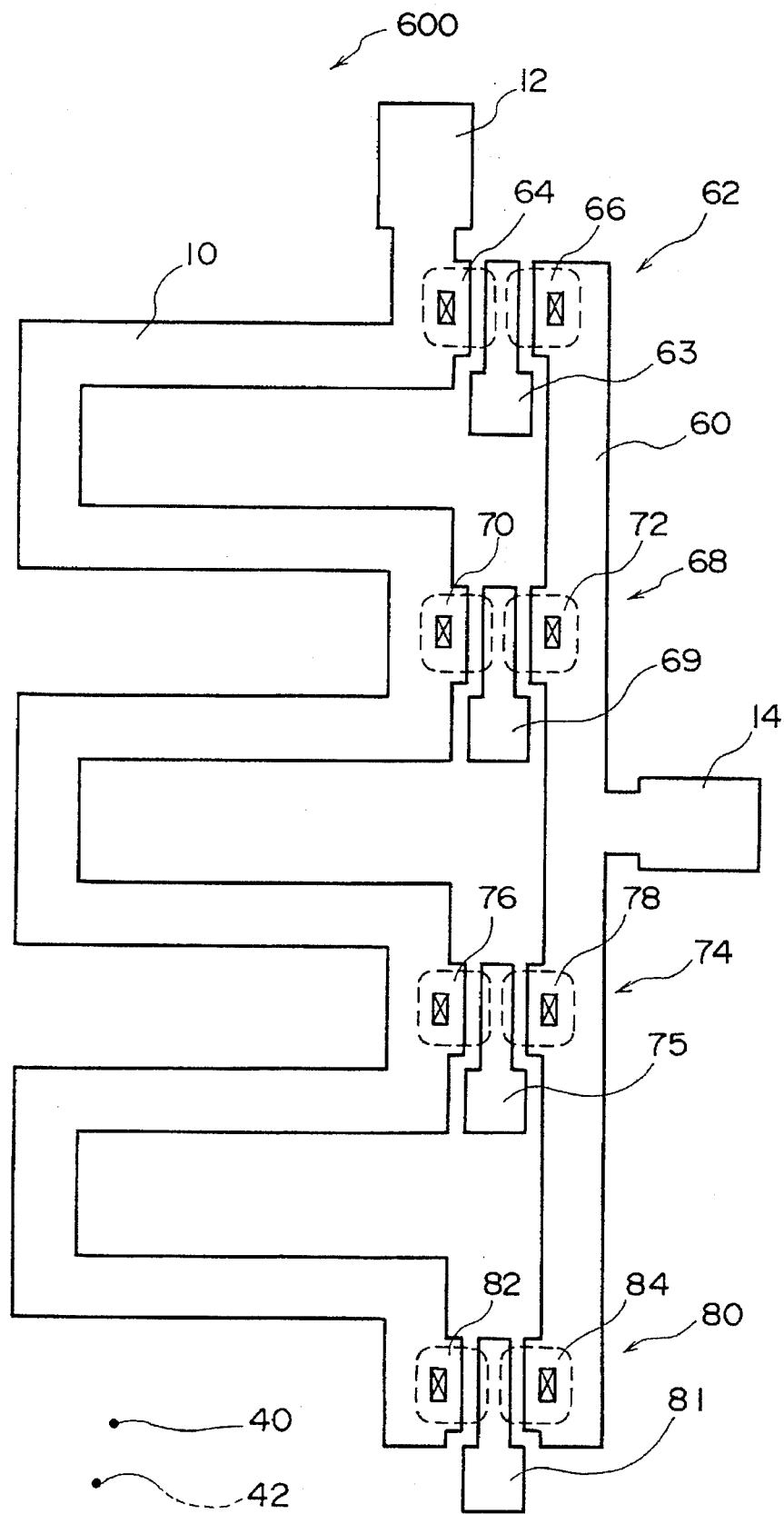
FIG. 18 is a plan view of a variable inductance element in accordance with a sixth embodiment of this invention.

FIG. 18 is a plan view of a variable inductance element according to the sixth embodiment.

As shown in the figure, the variable inductance element 600 comprises a meander shaped inductor conductor 10 and a linear shape conductor 60 formed via an insulation layer 40 on the surface of an n-Si substrate 42, and includes four switches 62, 68, 74 and 80 for connecting the inductor conductor 10 and the linear shape conductor 60.

The inductor conductor 10 is provided with the four switches 62, 68, 74 and 80 at positions enabling connection of different meander portions with portions of the linear shape conductor 60. The linear shape conductor is also provided with an input/output terminal 14 having a wide shape.

Switch 62 electrically connects the meander portion of the inductor conductor 10 closest to the input/output terminal 12 and a portion of the linear shape conductor 60. The switch 62 comprises a T-shaped gate electrode 63 formed on the surface of the insulation layer 40 and two diffusion regions 64 and 66 formed near the surface of the n-Si substrate 42 so as to overlap portions of the gate electrode 63. When a predetermined negative voltage is applied to the gate electrode 63, a p channel is formed between the two diffusion regions 64 and 66, and the switch 62 is set to the on state. As a result, the meander portion of the inductor conductor 10 closest to the input/output terminal 12 and the linear shape conductor 60 are mutually connected.

In the same manner, switch 68 electrically connects the second closest meander portion to the input/output terminal 12 of the inductor conductor 10 and a portion of the linear shape conductor 60. The switch 68 comprises a T-shaped gate electrode 69 formed on the surface of the insulation layer 40 and two diffusion regions 70 and 72 formed near the surface of the n-Si substrate 42 so as to overlap portions of the gate electrode 69. When a predetermined negative voltage is applied to the gate electrode 69, the switch 68 on state is produced, thereby mutually connecting the second closest meander portion of the inductor conductor 10 to the input/output terminal 12 and the linear shape conductor 60.

Switch 74 electrically connects the third closest meander portion of the inductor conductor 10 to the input/output terminal 12 and a portion of the linear shape conductor 60. The switch 74 comprises a T-shaped gate electrode 75 formed on the surface of the insulation layer 40 and two diffusion regions 76 and 78 formed near the surface of the n-Si substrate 42 so as to overlap portions of the gate electrode 63. When a predetermined negative voltage is applied to the gate electrode 75, a p channel is formed between the two diffusion regions 76 and 78, and the switch 74 is set to the on state. As a result, the meander portion of the inductor conductor 10 third closest to the input/output terminal 12 and the linear shape conductor 60 are mutually connected.

Switch 80 electrically connects the meander portion of the inductor conductor 10 farthest from the input/output terminal 12 and a portion of the linear shape conductor 60. The switch 80 comprises a T-shaped gate electrode 81 formed on the surface of the insulation layer 40 and two diffusion regions 82 and 84 formed near the surface of the n-Si substrate 42 so as to overlap portions of the gate electrode 81. When a predetermined negative voltage is applied to the gate electrode 81, a p channel is formed between the two diffusion regions 82 and 84, and the switch 80 is set to the on state. As a result, the meander portion of the inductor conductor 10 farthest from the input/output terminal 12 and the linear shape conductor 60 are mutually connected.

The cross-sectional construction of the respective switches 62, 68, 74 and 80 is the same as indicated in FIG. 7. When predetermined negative voltage is respectively applied to the gate electrodes 63, 69, 75 and 81, channels are formed between the respective diffusion regions 64, 70, 76 and 82, and diffusion regions 66, 72, 78 and 84, thereby performing the predetermined switching operation.

In this manner, when only switch 80 is in the on state, the variable inductance element 600 of this embodiment effectively functions as an approximately three meander cycle inductor between input/output terminals 12 and 14; when only switch 74 is on, the function is an approximately two meander cycle inductor; and when only switch 68 is on, the function is an approximately one meander cycle inductor. In addition, when only switch 62 is on, an inductor having a meander shape is not formed and an element having a very small inductance is comprised. Consequently, by changing the gate electrode for applying the predetermined voltage, the inductance between the two input/output terminals 12 and 14 can be variably set.

The variable inductance element 600 also includes such advantages of the above mentioned first to fourth embodiments as manufacturing by utilizing ordinary semiconductor manufacturing technology, in which case down-sizing and mass production are enabled, and others.

OTHER EMBODIMENTS

Following are descriptions of variable inductance elements related to other embodiments of this invention with reference to the attached drawings.

Figure 19:
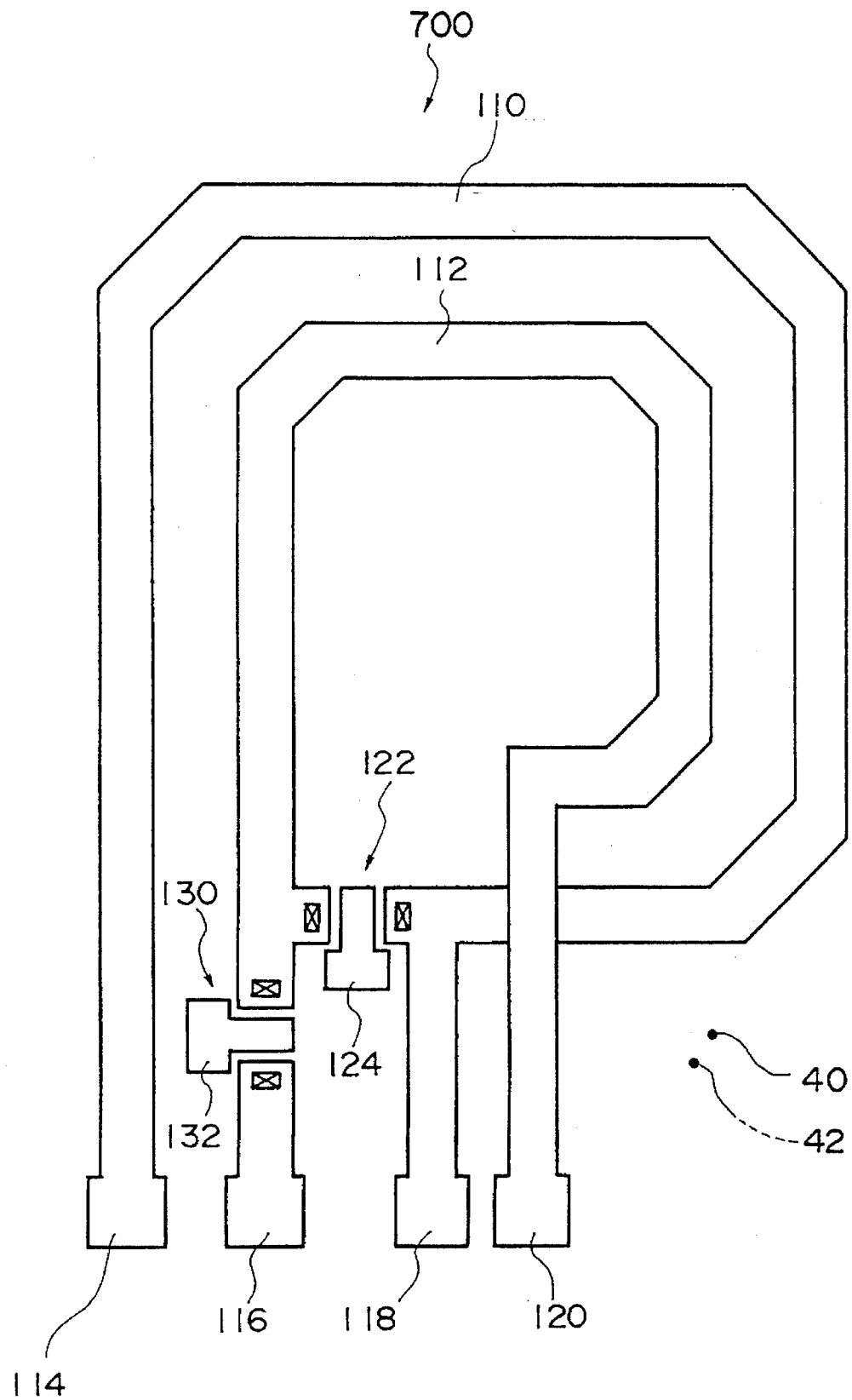
FIG. 19 is a plan view of a variable inductance element in accordance with a seventh embodiment of this invention.
Figure 20:
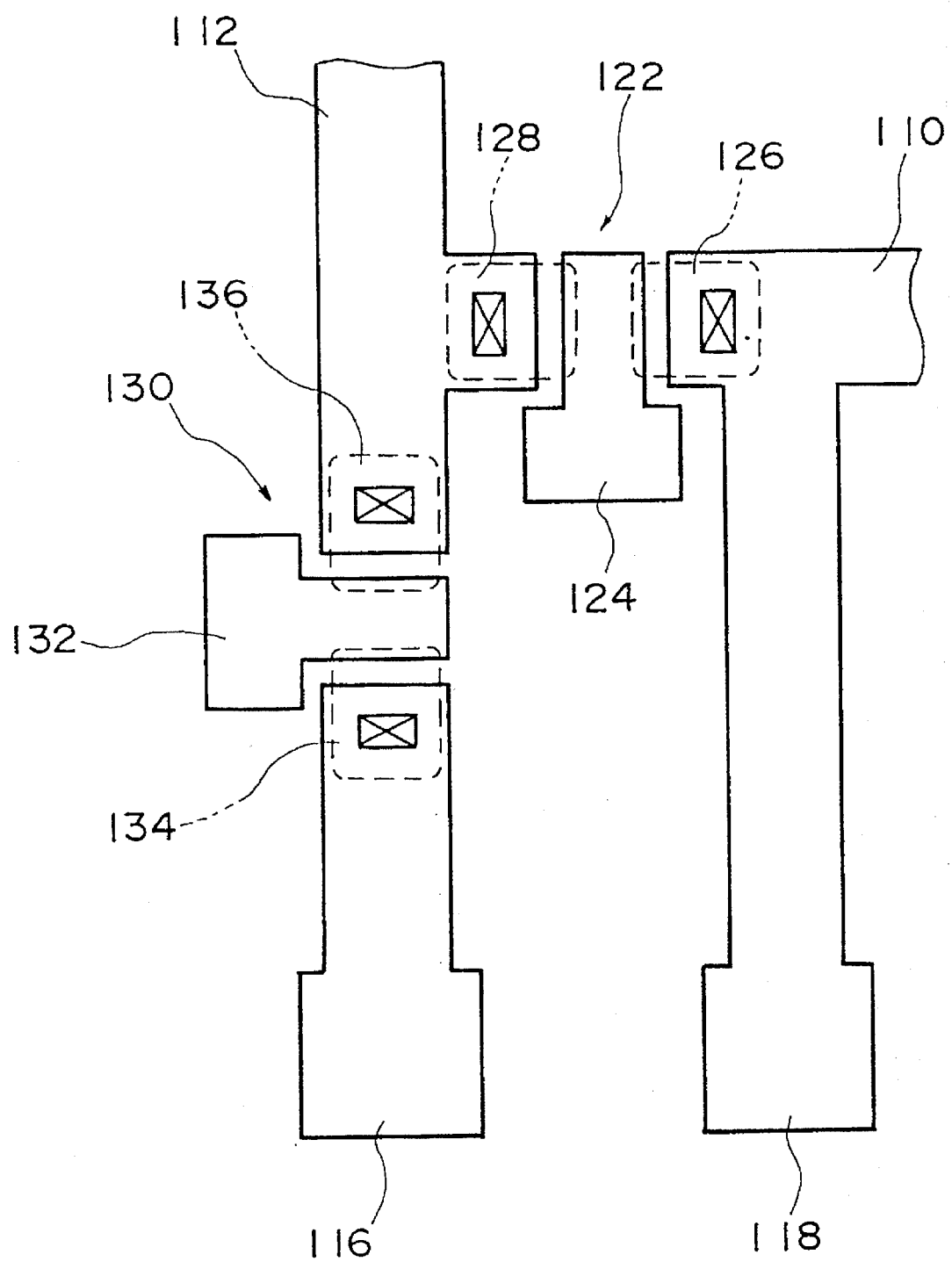
FIG. 20 is an enlarged fragmentary plan view of the variable inductance element shown in FIG. 19.

FIG. 19 is a plan view of a variable inductance element according to a seventh embodiment of this invention. FIG. 20 is an enlarged segmentary plan view near the switches of the variable inductance element indicated in FIG. 19.

As indicated in the figures, the variable inductance element 700 comprises two circular inductor conductors 110 and 112 having essentially one turn circular shapes, and two switches 122 and 130 for connecting and separating these.

One end of the circular inductor conductor 110 comprises an input/output terminal 114 having a wide shape, and the other end is connected via switch 122 to circular inductor conductor 112, while a portion is branched toward an input/output terminal 118. Also, one end of the circular inductor conductor 112 comprises an input/output terminal 120 having a wide shape, and the other end is connected via the above mentioned switch 122 to the circular inductor conductor 110 and also via switch 130 to an input/output terminal 116.

Switch 122 is for connecting the two circular inductor conductors 110 and 112. The switch 122 comprises a T-shaped gate electrode 124 formed on the surface of the insulation layer 40 and two diffusion regions 126 and 128 formed near the surface of the n-Si substrate 42 so as to overlap portions of the gate electrode 124. When a predetermined negative voltage is applied to the gate electrode 124, the switch 122 is set to the on state.

Switch 130 is for connecting one end of the circular inductor conductor 112 and the input/output terminal 116. The switch 130 comprises a T-shaped gate electrode 132 formed on the surface of the insulation layer 40 and two diffusion regions 134 and 136 formed near the surface of the n-Si substrate 42 so as to overlap portions of the gate electrode 132. When a predetermined negative voltage is applied to the gate electrode 132, the switch 130 is set to the on state.

In this manner, when only switch 122 is in the on state, the two circular inductor conductors 110 and 112 are connected and an approximately two turn coil is comprised between the two input/output terminals 114 and 120. When switch 130 is on and switch 122 is off, an approximately one turn coil is comprised by the circular inductor conductor 110 between the input/output terminals 114 and 120, while an approximately one turn coil is comprised by the circular inductor conductor 112 between the input/output terminals 116 and 118.

Consequently, by appropriately selecting the respective on/off states of the switches 122 and 130, the overall approximately two turn coil can be divided according to requirements. Also, since the inductance changes according to the number of coil turns formed between the respective input/output terminals and according to which circular inductor conductor is used, by selecting the input/output terminals according to requirements, the variable inductance element 700 of this embodiment can be used as an element having a plurality of inductances.

The above description referred to an example of forming an overall approximately two turn coil. However, by increasing the respective numbers of turns, switches and input/output terminals, the quantity of selectable inductances can be increased. Also, the plurality of circular inductor conductors need not be concentrically disposed, but adjacently disposed inductor conductors can also be connected or separated.

Figure 21:
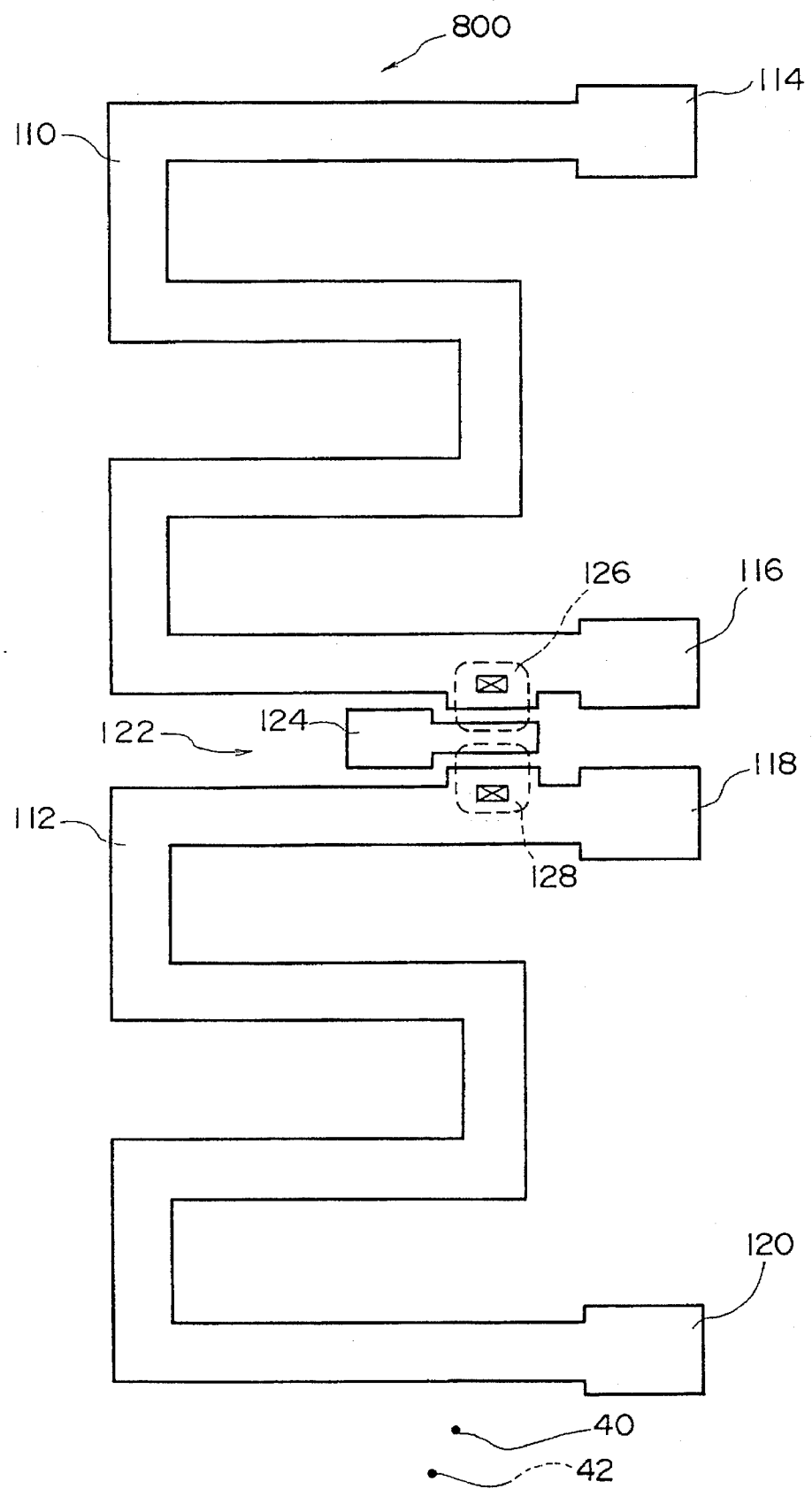
FIG. 21 is a plan view of a variable inductance element in accordance with a eighth embodiment of this invention.

FIG. 21 is a plan view of a variable inductance element according to an eighth embodiment of this invention. As shown in the figure, the variable inductance element 800 comprises inductor conductors 110 and 112 respectively having essentially 1.5 cycle meander shapes, and includes a switch 122 for connecting and separating these.

Input/output terminals 114 and 116 are respectively provided at one end and the other end of the meander shaped inductor conductor 110. In the same manner, input/output terminals 118 and 120 are respectively provided at one end and the other end of the meander shaped inductor conductor 112. The meander shaped inductor conductors 110 and 112 can be electrically connected by the switch 122 disposed at a position near the input/output terminals 116 and 118.

Switch 122 is for connecting the two meander shaped inductor conductors 110 and 112. The switch 122 comprises a T-shaped gate electrode 124 formed on the surface of the insulation layer 40 and two diffusion regions 126 and 128 formed near the surface of the n-Si substrate 42 so as to overlap portions of the gate electrode 124. When a predetermined negative voltage relative to the substrate 42 and the diffusion regions 126 and 128 is applied to the gate electrode 124, the switch 122 is set to the on state.

In this manner, when switch 122 is in the off state, the variable inductance element 800 can be used as two separate inductor elements, each having approximately 1.5 meander cycles. In other words, one of these two inductor elements comprises input/output terminals 114 and 116, and meander shaped inductor conductor 110, while the other of these elements comprises input/output terminals 118 and 120, and meander shaped inductor conductor 112.

When switch 122 is in the on state, the two meander shaped inductor conductors 110 and 112 are connected to form an approximately three meander cycle inductor conductor between input/output terminals 114 and 120.

Consequently, by appropriately selecting the on/off states of switch 122, the overall approximately three meander cycle inductor can be divided according to requirements.

The above description referred to an example of forming an overall approximately three meander cycle inductor conductor. However, by increasing the respective numbers of meander cycles, switches and input/output terminals, the quantity of selectable inductances can be increased.

Figure 22:
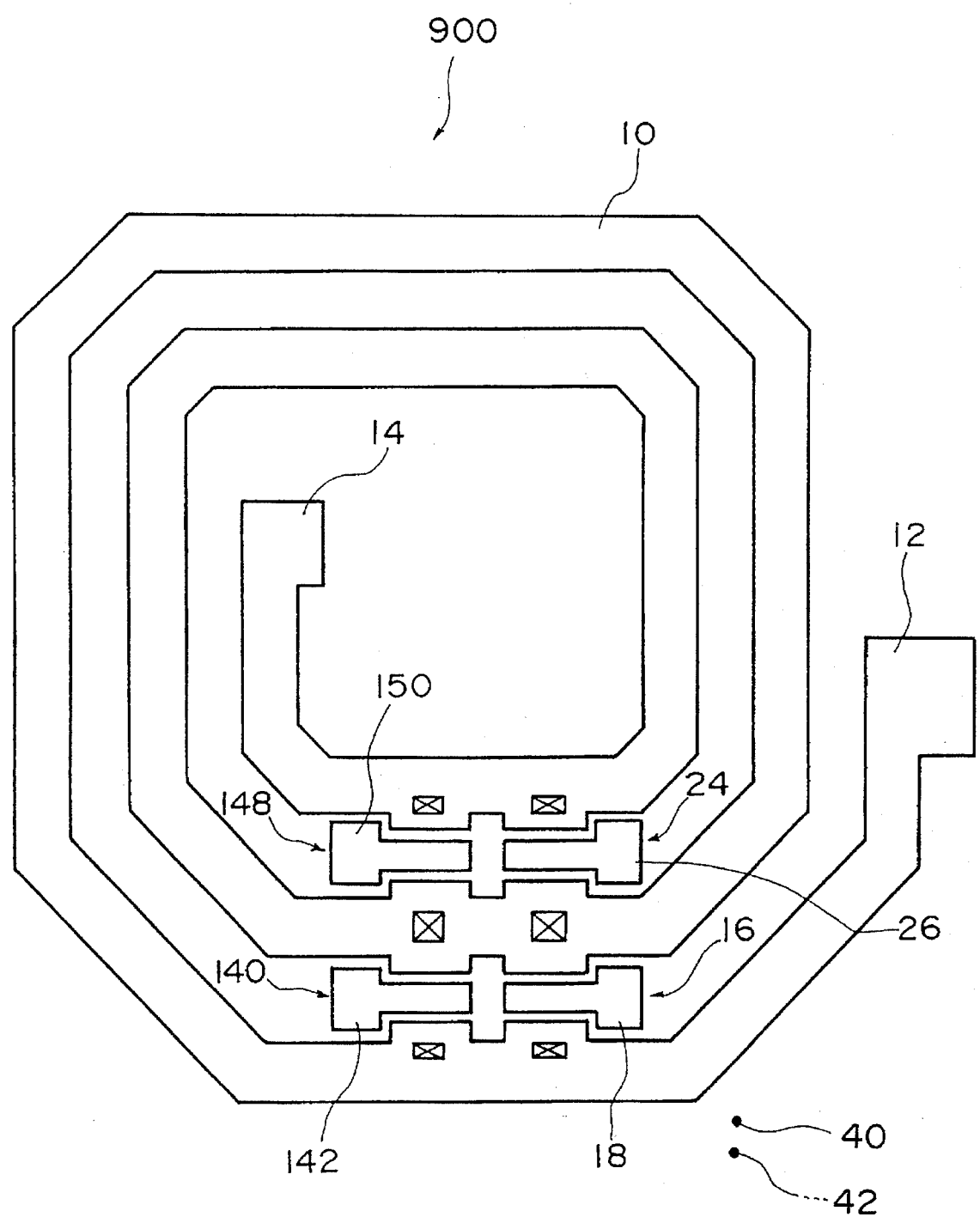
FIG. 22 is a plan view of a variable inductance element in accordance with a ninth embodiment of this invention.
Figure 23:
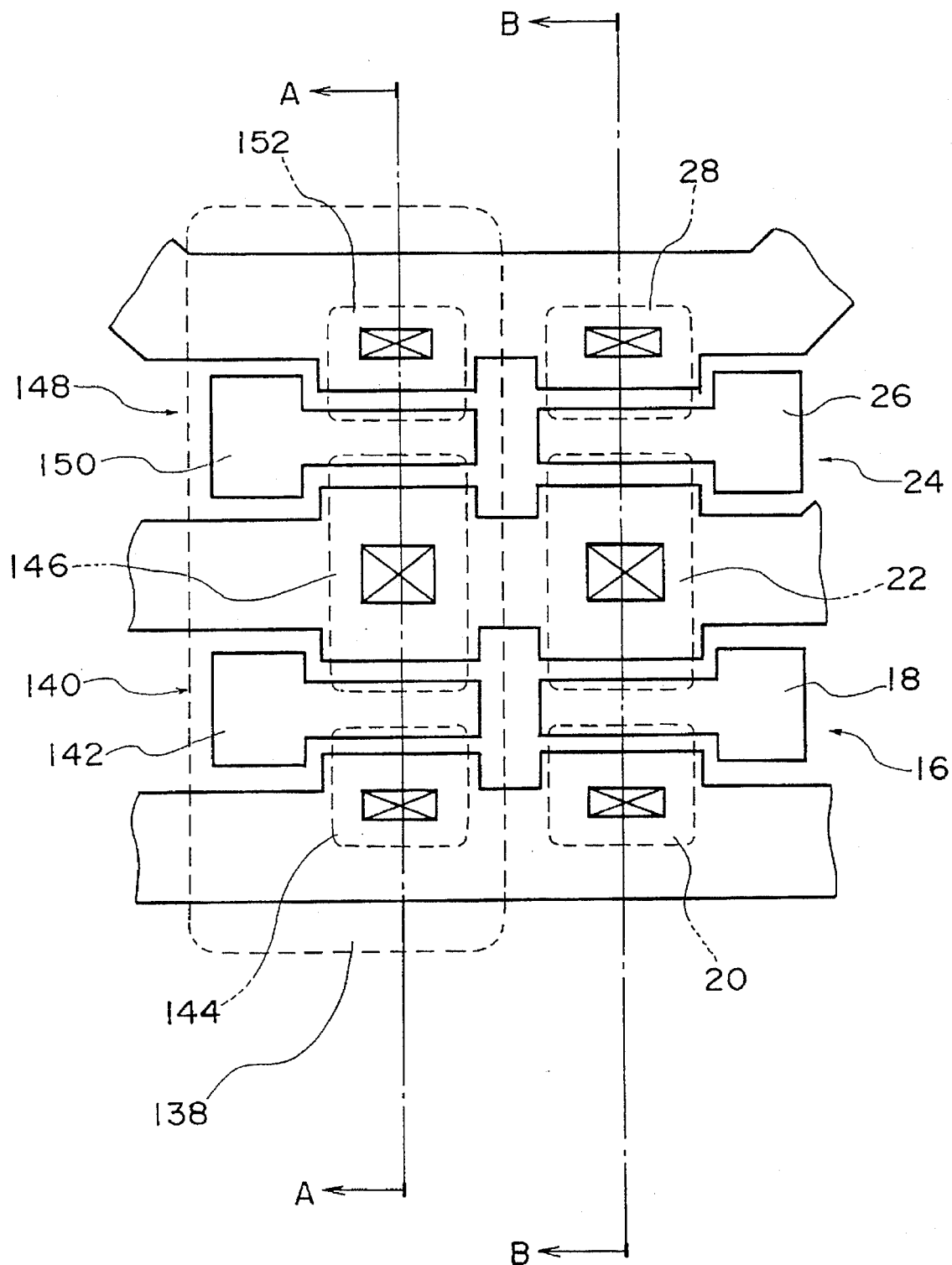
FIG. 23 is an enlarged fragmentary plan view of the variable inductance element shown in FIG. 22.

FIG. 22 is a plan view of a variable inductance element according to a ninth embodiment of this invention. FIG. 23 is an enlarged segmentary plan view near the switches of the variable inductance element shown in FIG. 22.

The variable inductance element 900 of this embodiment features improved switch portion performance for the variable resistance element 100 shown in FIGS. 1 and 2. In general, a potential difference exists between the source and drain of a field effect transistor. As this potential difference is reduced, the on state resistance between the source and drain tends to sharply increase. For this reason, when the voltage level of a signal input via input/output terminal 12 or 14 approaches the gate voltage applied to gate electrodes 18 and 26, since the resistance between the two input/output terminals increases, signal attenuation gets significant. In order to prevent this rapid on state resistance rise, the variable resistance element 900 utilizes a transmission gate comprising a p channel FET and an n channel FET connected in parallel to perform switching operation.

As indicated in FIGS. 22 and 23, compared with the variable resistance element 100 shown in FIGS. 1 and others, the variable resistance element 900 of this embodiment further comprises two switches 140 and 148 respectively comprising n channel FETs. The two switches 140 and 148 are formed near the surface of a p well 138 formed in a portion of the n-Si substrate 42.

Switch 140 is connected in parallel with switch 16 and functions to short the outermost and second from outermost circumferences of the spiral shaped inductor conductor 10 and comprises a gate electrode 142 and two diffusion regions 144 and 146 respectively corresponding to the switch 16 gate electrode 18 and diffusion regions 20 and 22.

When a predetermined positive voltage of the same size but reverse polarity to the voltage applied to the switch 16 gate electrode 18 is applied to the switch 140 gate electrode 142, an n channel is formed between the two diffusion regions 144 and 146, thereby producing the conducting state.

In the same manner, switch 148 is connected in parallel with switch 24 and functions to short the second from outermost and innermost circumferences of the spiral shaped inductor conductor 10 and comprises a gate electrode 150 and two diffusion regions 146 and 152 respectively corresponding to the switch 24 gate electrode 26 and diffusion regions 22 and 28.

When a predetermined positive voltage of the same size but reverse polarity to the voltage applied to the switch 24 gate electrode 26 is applied to the switch 148 gate electrode 150, an n channel is formed between the two diffusion regions 146 and 152, thereby producing the conducting state.

Figures 24A, 24B:
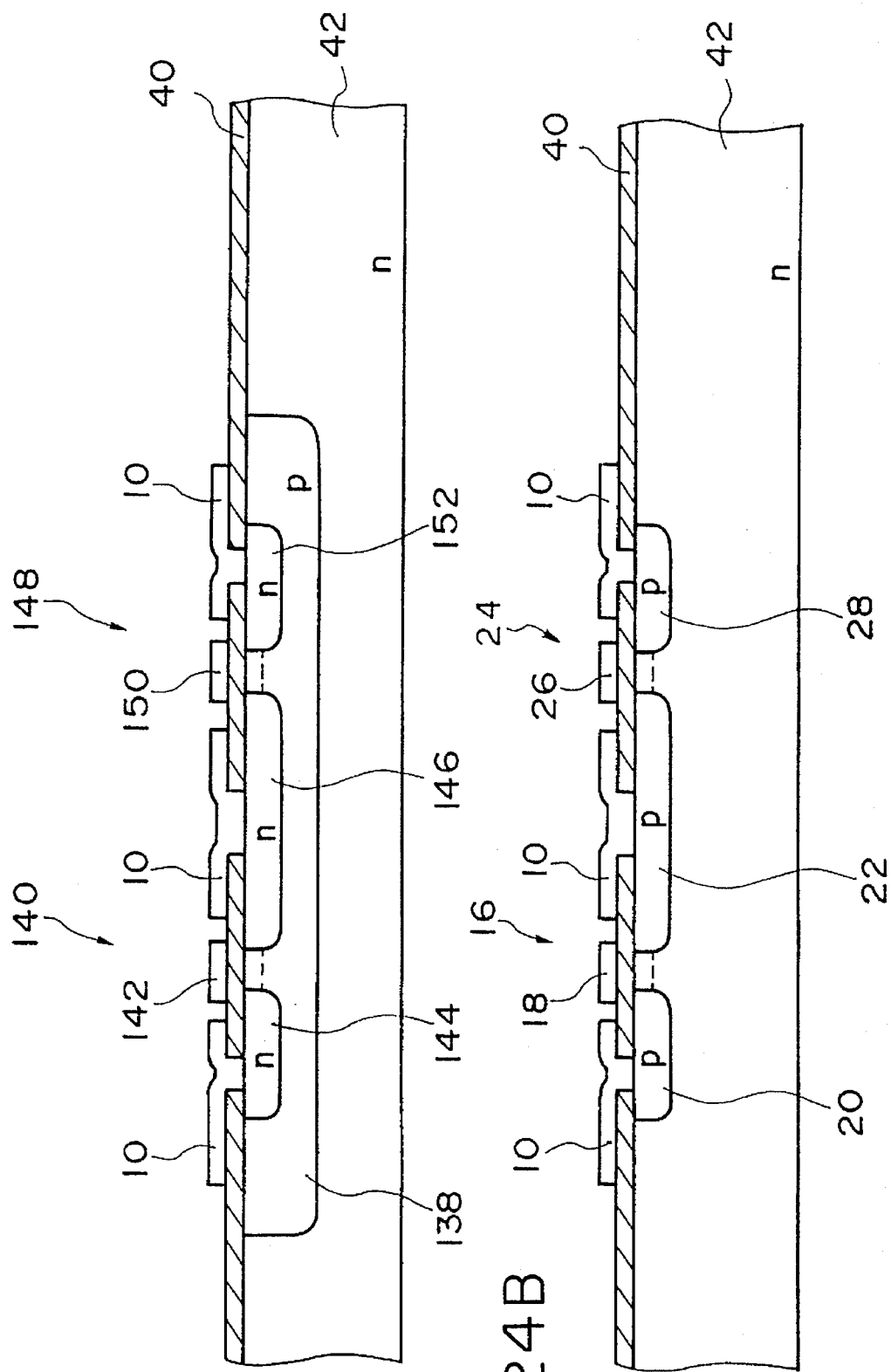
FIGS. 24A and 24B are cross-sectional views viewed respectively along lines A—A and B—B in FIG. 23.

FIGS. 24A and 24B are fragmentary cross-sectional views of the variable inductance element 900. FIG. 24A is a cross-sectional view viewed along line A—A in FIG. 23 and indicates the state where both the n channel FET switch 140 comprising the gate electrode 142 and two diffusion regions 144 and 146 formed in the p well 138 formed in a portion (near the surface) of the n-Si substrate 42, and the n channel FET switch 148 comprising the gate electrode 150 and two diffusion regions 146 and 152 are formed. Also, FIG. 24B is a cross-sectional view viewed along line B—B in FIG. 23 and basically does not differ from the cross-sectional construction of the first embodiment shown in FIG. 3.

In this manner, by using the parallel connected switches 16 and 140 (or the parallel connected switches 24 and 148) as a transmission gate, for example, as the voltage level of a signal input to the input/output terminal 12 or 14 approaches the gate voltage applied to the gate electrode 18 of one of the switches 16, this signal voltage level recedes from the gate voltage applied to the gate 142 of the other switch 140, and the overall on state resistance of the parallel circuit comprising the switches 16 and 140 does not increase. Conversely, as the voltage level of the input signal approaches the gate voltage applied to the gate electrode 142 of the other switch 140, this signal voltage level recedes from the gate voltage applied to the gate electrode 18 of the switch 16, and the overall on state resistance of the parallel circuit comprising the switches 16 and 140 does not increase.

As a result, a continuously stable on state resistance is obtained by using a transmission gate and the characteristics of the variable inductance element 900 can also be stabilized.

Figure 25:
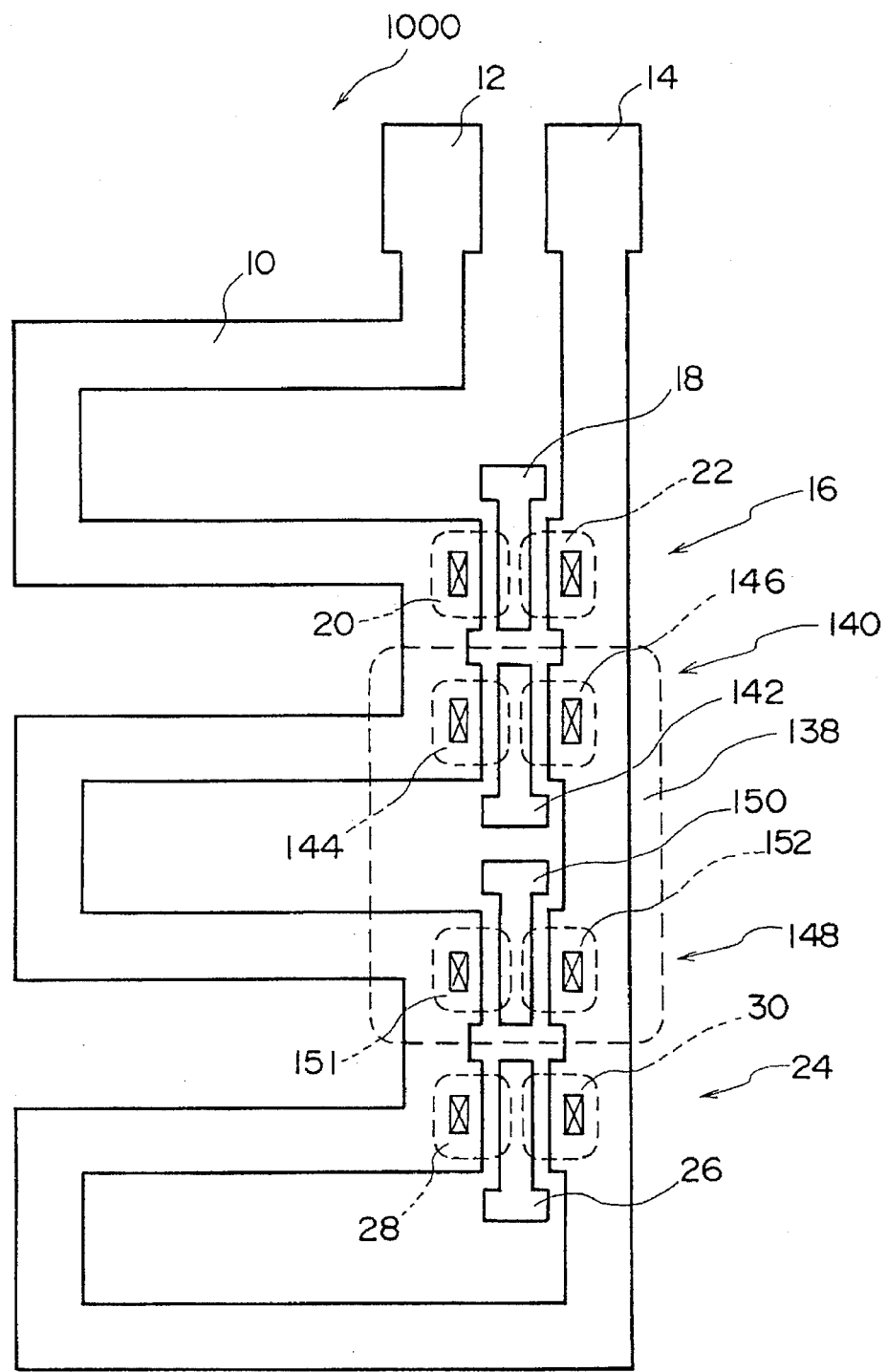
FIG. 25 is a plan view of a variable inductance element in accordance with a tenth embodiment of this invention.
Figure 26:
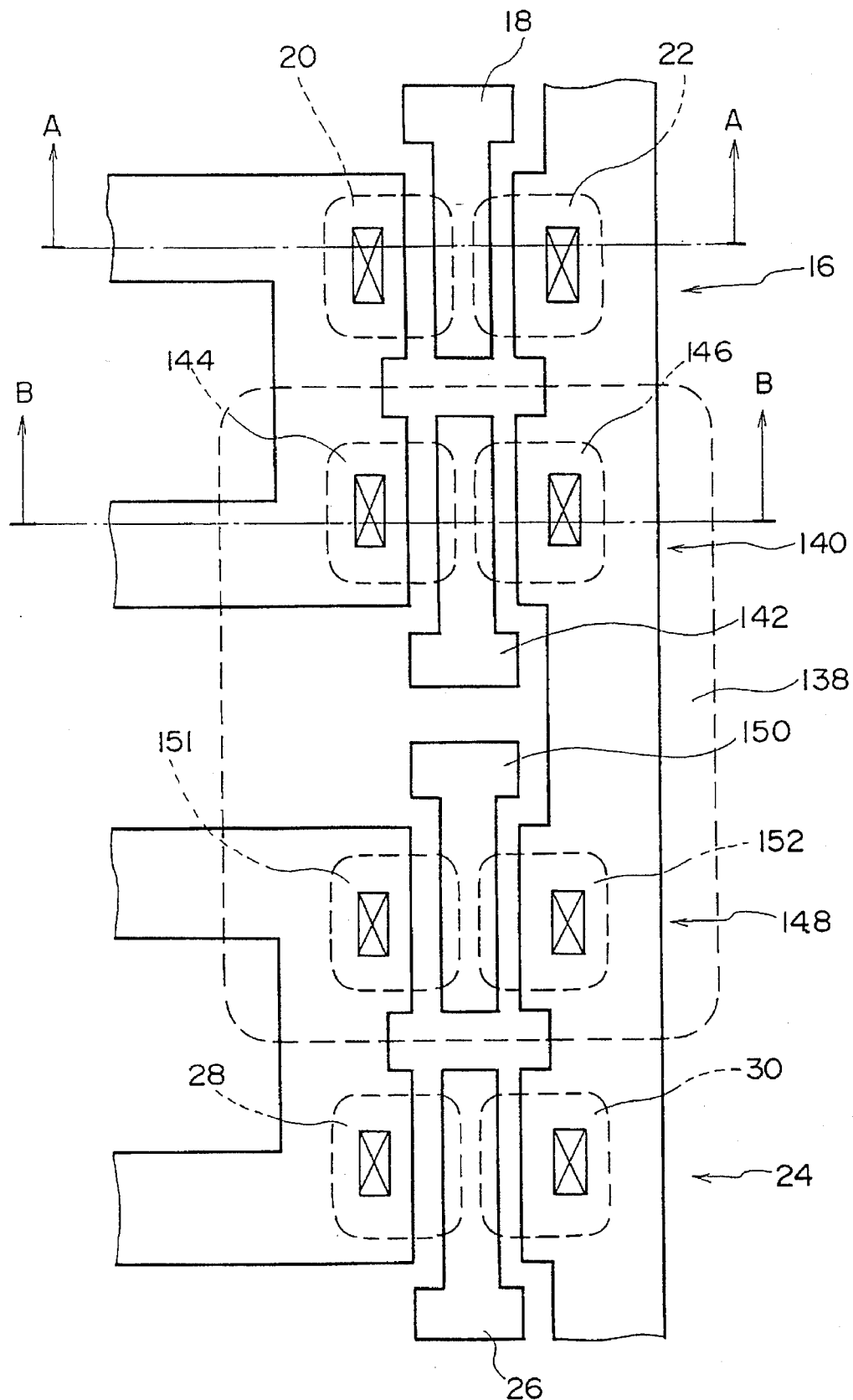
FIG. 26 is an enlarged fragmentary plan view of the variable inductance element shown in FIG. 25.

FIG. 25 is a plan view of a variable inductance element according to a tenth embodiment of this invention. FIG. 26 is an enlarged segmentary plan view near the switches of the variable inductance element indicated in FIG. 25.

The variable inductance element 1000 of this embodiment features improved switch portion performance for the variable resistance element 200 shown in FIGS. 5 and 6. In general, a potential difference exists between the source and drain of a field effect transistor. As this potential difference is reduced, the on state resistance between the source and drain tends to sharply increase. For this reason, when the voltage level of a signal input via input/output terminal 12 or 14 approaches the gate voltage applied to gate electrodes 18, 26 and 34, since the resistance between the two input/output terminals 12 and 14 increases, signal attenuation gets significant. In order to prevent this rapid on state resistance rise, the variable resistance element 1000 utilizes a transmission gate comprising a p channel FET and an n channel FET connected in parallel to perform switching operation.

As indicated in FIGS. 25 and 26, compared with the variable resistance element 200 shown in FIGS. 5 and others, the variable resistance element 1000 of this embodiment further comprises two switches 140 and 148 respectively comprising n channel FETs. The two switches 140 and 148 are formed near the surface of a p well 138 formed in a portion of the n-Si substrate 42.

Switch 140 is connected in parallel with switch 16 and functions to short the first meander cycle portion and the linear return portion of the inductor conductor 10 and comprises a gate electrode 142 and two diffusion regions 144 and 146 respectively corresponding to the switch 16 gate electrode 18 and diffusion regions 20 and 22.

When a predetermined positive voltage of the same size but reverse polarity to the voltage applied to the switch 16 gate electrode 18 is applied to the switch 140 gate electrode 142, an n channel is formed between the two diffusion regions 144 and 146, thereby producing the conducting state.

In the same manner, switch 148 is connected in parallel with switch 24 and functions to short the second meander portion and the linear return portion of the inductor conductor 10 and comprises a gate electrode 150 and two diffusion regions 151 and 152 respectively corresponding to the switch 24 gate electrode 26 and diffusion regions 28 and 30.

When a predetermined positive voltage of the same size but reverse polarity to the voltage applied to the switch 24 gate electrode 26 is applied to the switch 148 gate electrode 150, an n channel is formed between the two diffusion regions 151 and 152, thereby producing the conducting state.

Figure 27A:
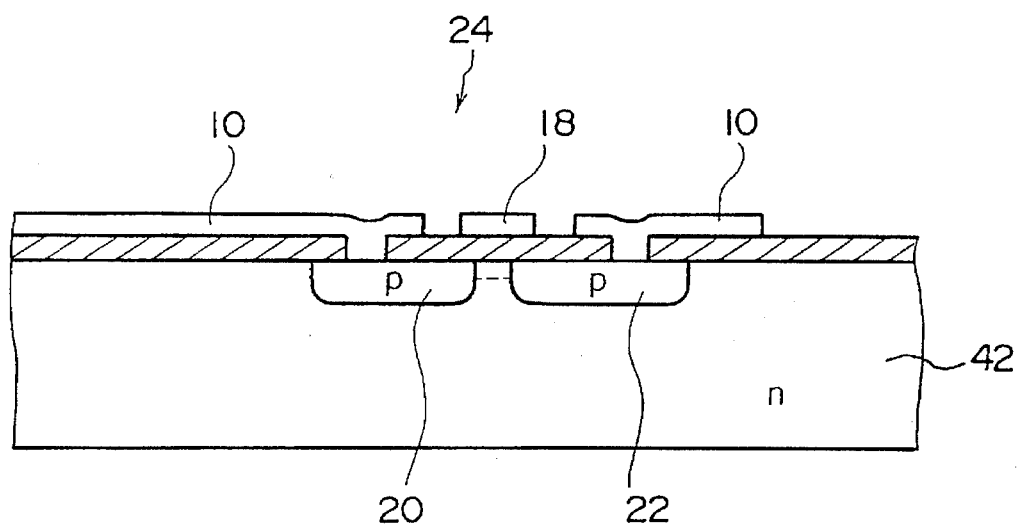
FIGS. 27A and 27B are cross-sectional views viewed respectively along lines A—A and B—B in FIG. 26.
Figure 27B:
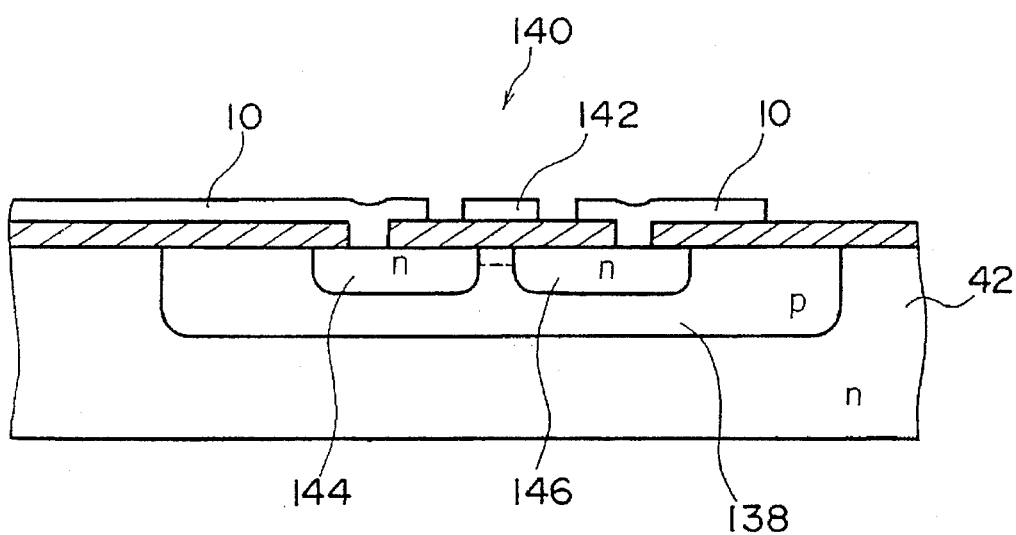

FIGS. 27A and 27B are fragmentary cross-sectional views of the variable inductance element 1000. FIG. 27A is a cross-sectional view viewed along line A—A in FIG. 26 and basically does not differ from the cross-sectional construction of the second embodiment shown in FIG. 7. FIG. 27B is a cross-sectional view viewed along line B—B in FIG. 26 and indicates the state where an n channel FET switch 140 comprising the gate electrode 142 and two diffusion regions 144 and 146 formed in the p well 138 formed in a portion (near the surface) of the n-Si substrate 42.

In this manner, by using the parallel connected switches 16 and 140 (or the parallel connected switches 24 and 148) as a transmission gate, for example, as the voltage level of a signal input to the input/output terminal 12 or 14 approaches the gate voltage applied to the gate electrode 18 of one of the switches 16, this signal voltage level recedes from the gate voltage applied to the gate 142 of the other switch 140, and the overall on state resistance of the parallel circuit comprising the switches 16 and 140 does not increase. Conversely, as the voltage level of the input signal approaches the gate voltage applied to the gate electrode 142 of the other switch 140, this signal voltage level recedes from the gate voltage applied to the gate electrode 18 of the switch 16, and the overall on state resistance of the parallel circuit comprising the switches 16 and 140 does not increase.

As a result, a continuously stable on state resistance is obtained by using a transmission gate and the characteristics of the variable inductance element 1000 can also be stabilized.

Figure 28:
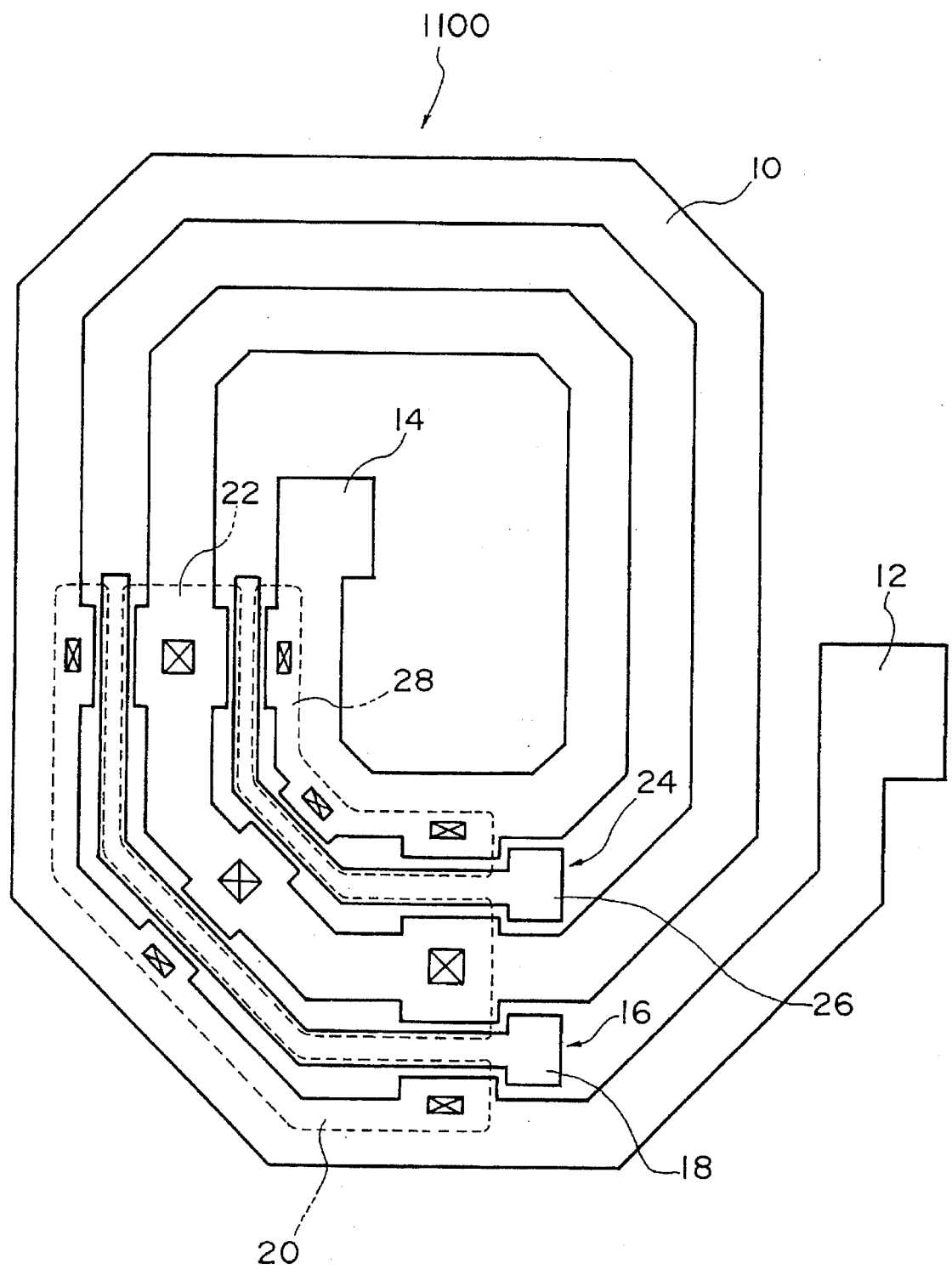
FIG. 28 is a plan view of a variable inductance element in accordance with a eleventh embodiment of this invention.

FIG. 28 is a plan view of a variable inductance element according to an eleventh embodiment of this invention.

In the case of the variable inductance element 1100 of this embodiment, the switches 16 and 24 of the first embodiment variable inductance element 100 shown in FIG. 1 are respectively extended along the spaces between the spiral shaped inductor conductor 10. In other words, when noting switch 16, the gate electrode 18 and the diffusion regions 20 and 22 are respectively extended in length for approximately ¼ turn of the spiral shaped inductor conductor 10. Similarly, when noting the other switch 24, the gate electrode 26 and the diffusion regions 22 and 28 are respectively extended in length for approximately ¼ turn of the spiral shaped inductor conductor 10.

In this manner, by increasing the lengths of the switches 16 and 24 in the circumference direction, the on state resistance can be substantially reduced. As a result, the signal level attenuation of an input/output signal via the switches 16 and 24 can be suppressed to the extent where it is negligible for practical purposes.

Although the above description referred to an example of increasing the lengths of the gate electrodes 18 and 26 etc. by approximately ¼ turn, these can also be extended to approximately one turn. In this case, the on state resistance of the switches 16 and 24 can be further reduced, while closed loop formation by the switch 16 and 24 on states can be eliminated.

Figure 29:
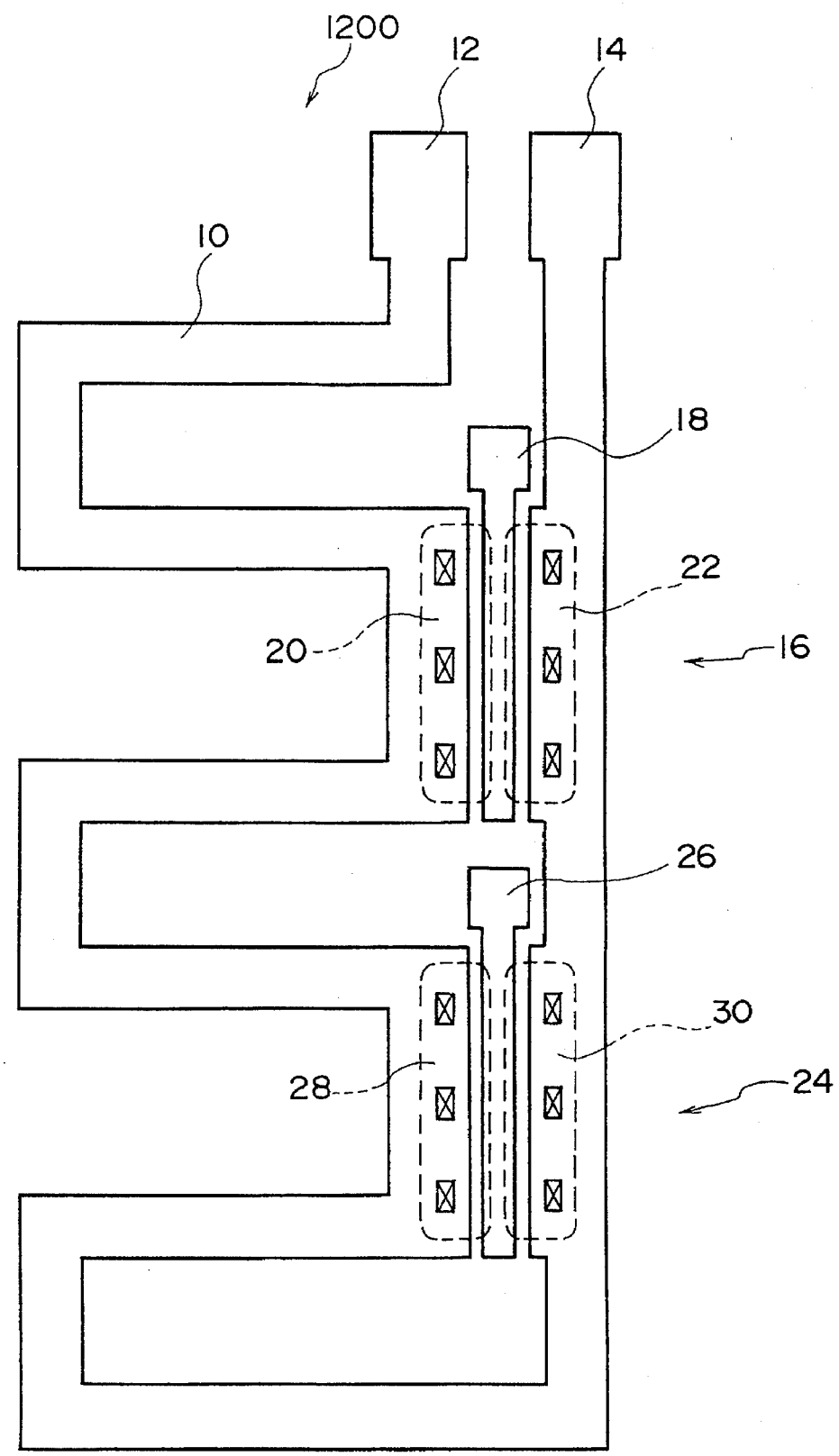
FIG. 29 is a plan view of a variable inductance element in accordance with a twelfth embodiment of this invention.

FIG. 29 is a plan view of a variable inductance element according to a twelfth embodiment of this invention.

In the case of the variable inductance element 1200 of this embodiment, switches of the variable inductance element 200 indicated in FIG. 5 are respectively extended along the spaces between the meander cycle portions and linear return portions of the inductor conductor 10. In other words, when noting switch 16, the gate electrode 18 and the diffusion regions 20 and 22 are respectively extended in length for the entire length wherein the meander shaped and linear return portions of the inductor conductor 10 are adjacent. Similarly, when noting the other switch 24, the gate electrode 26 and the diffusion regions 28 and 30 are respectively extended in length for the entire length wherein the meander shaped and linear return portions of the inductor conductor 10 are adjacent.

In this manner, by increasing the lengths of the switches 16 and 24, the on state resistance can be substantially reduced. As a result, the signal level attenuation of an input/output signal via the switches 16 and 24 can be suppressed to the extent where it is negligible for practical purposes.

Figure 30:
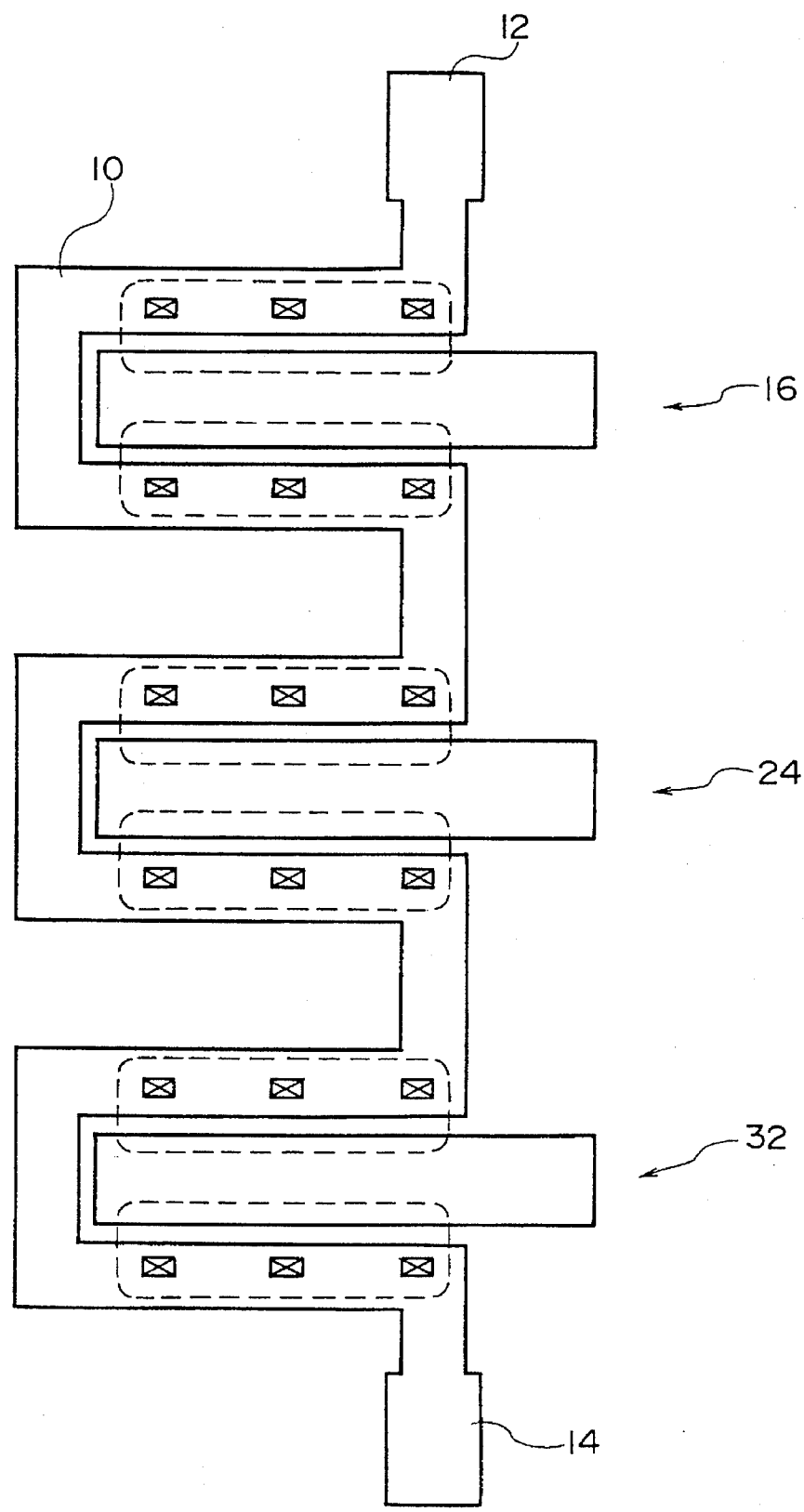
FIG. 30 shows an example of a variation of the variable inductance element of the twelfth embodiment.

FIG. 30 indicates an example of a variation of the twelfth embodiment applying the present invention to the variation of the second embodiment shown in FIG. 8. By extending the lengths of the switches 16, 24 and 32, the on state resistance can be substantially reduced. The respective meander portions of the inductor conductor 10 corresponding to each switch can be reliably shorted and the inductance can be reliably changed.

Figure 31:
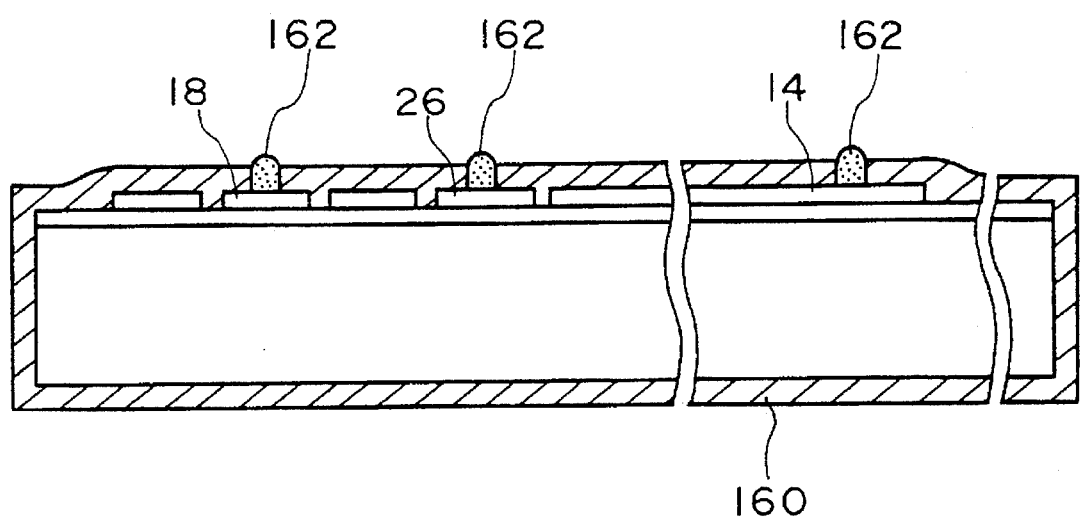
FIG. 31 is a descriptive drawing of providing terminals using chemical liquid phase deposition.

FIG. 31 is a descriptive drawing of providing terminals using chemical liquid phase deposition and is an enlarged cross-sectional view, which corresponds to a cross-section viewed along line A—A in FIG. 1.

As shown in the figure, after separating the semiconductor substrate including the variable inductance element 100, a silicon oxide film 160 is formed as an insulation film on the entire surface of the individual separated chip (element) by chemical liquid phase deposition. The silicon oxide film over the input/output terminals 12 and 14, and the gate electrodes 18 and 26 is then removed by etching to open perforations. By closing the perforations by applying solder 162 to the extent of protruding slightly above the surface, since the protruding solder can be brought into direct contact with such structures as printed wiring board lands, the condition is favorable for surface mounting.

A protective layer can be formed on the element surface by using such insulating material as synthetic resin and perforations opened by laser light emission.

The foregoing descriptions of the embodiments do not limit this invention, and numerous variations are possible within the scope of this invention.

For example, the above descriptions referred to forming a single element on a semiconductor substrate 42. However, it is also possible to simultaneously form a plurality of the same or different types of variable inductance elements on the same semiconductor substrate 42, respectively separate these, then afterwards provide terminals for the input/output and gate electrodes.

Also, since the above mentioned variable inductance elements are formed on a semiconductor substrate as in the case of an ordinary transistor or other element, the variable inductance element of any one of the foregoing embodiments can be formed as a portion of an LSI or other circuit.

Also, since field effect transistors are used for variably setting the inductance of the above described variable inductance elements, there is an unavoidable on-state resistance which is temperature dependent. Consequently, a positive temperature coefficient (PTC) or negative temperature coefficient (NTC) thermistor can be connected internally or externally to the variable inductance element for compensating this temperature dependent on-state resistance.

Also, means other than field effect transistors, such as bipolar transistors or other elements, can be used for the switches of the above described variable inductance elements.

Also, although the forgoing descriptions referred to an example of independently using the variable inductance elements, by arranging the inductor conductors of the above mentioned variable inductance elements opposingly or essentially in parallel, a distributed constant type capacitor can be formed between the inductor conductor 10 and the added inductor conductor, thereby comprising LC elements.

Also, the foregoing descriptions referred to examples of effectively controlling the spiral shaped inductor conductor 10 turn quantity so as to vary the inductance of the variable inductance elements. However, in cases where the input/output signal is limited to the high frequency band, an inductor conductor shape other than spiral, for example, a sinusoidal or other variation of a meander shape, can be used, and adjacent inductor conductors shorted. With respect to a high frequency signal, this type of shape as well can have a predetermined inductance and this inductance can be variably controlled.

Also, an insulating or conductive magnetic film, for example, gamma ferrite or barium ferrite etc., can be used to cover one face or both faces of any one of the above mentioned variable inductance elements to provide magnetic shielding, thereby reducing mutual effects due to magnetic fields between the variable inductance element and adjacent circuits. Since covering with such material as gamma ferrite is performed by using thin-film formation technology and is applicable to semiconductor manufacturing technology, the variable inductance elements according to this invention can also be easily manufactured by utilizing semiconductor manufacturing technology. This feature is especially effective when combining variable inductance elements according to this invention with other semiconductor devices on a semiconductor substrate.

Various types of magnetic films, such as gamma ferrite, barium ferrite and others, can be used for the magnetic film. In particular, when a gamma ferrite, which is conventionally used as a magnetic recording medium, thin-film is formed on a substrate, the magnetic directionality resembles tiny magnets arranged on a flat surface, and the condition is favorable for forming an appropriate magnetic circuit. Also, if gamma ferrite is used, since the magnetic film can be formed by coating, manufacturing is easy.

Also, various types of materials and formation methods are possible for the magnetic film, for example, vacuum deposition of an FeO or other materials for forming magnetic film, as well as molecular beam epitaxy (MBE), chemical vapor deposition (CVD), sputtering, and other methods that can be used for forming the magnetic film.

Also, as methods for removing the magnetic film portions, the etching conventionally used a step of the semiconductor manufacturing process or laser light emission methods can be employed.

Since removal by etching can be included in the semiconductor manufacturing process, the magnetic film portions can be removed simultaneously with manufacturing an IC, LSI or other device including the variable inductance element and other components, thereby allowing the manufacturing process to be simplified. On the other hand, the laser light emission method offers an advantage of removing portions of the magnetic film with high dimensional accuracy.

Also, instead of insulating material, a conductive material such as metal powder (MP) can be used for the magnetic film. However, in this case, since there is risk of shorting the inductor turns and losing the function as an inductor, electrical insulation is needed between each inductor and the conductive magnetic film. Methods for providing this insulation include oxidizing the inductor to form an insulation oxide film, providing a silicon oxide film by chemical vapor deposition, and forming a nitride film.

What is claimed is:

1. A variable inductance element comprising:
   at least one inductor conductor having a predetermined shape,
   at least one switch functioning to separate and connect portions of said at least one inductor conductor, said at least one inductor conductor used one of independently and in combination with other inductor conductors, and
   a separate switch than the at least one switch for cutting off an unnecessary closed loop produced by said at least one inductor conductor according to a switch operating state.

2. A variable inductance element according to claim 1 wherein:
   said inductor conductor has a spiral shape.

3. A variable inductance element according to claim 2 further comprising:
   two input/output terminals provided at respective ends of said at least one inductor conductor, wherein by operation of said switch a length of said at least one inductor conductor between said two input/output terminals is changed to vary the inductance between said two input/output terminals.

4. A variable inductance element according to claim 2 wherein said at least one inductor conductor and said at least one switch are formed on a semiconductor substrate.

5. A variable inductance element according to claim 4 wherein said at least one switch comprises a field effect transistor having two diffusion regions respectively functioning as a source and a drain formed in portions of said semiconductor substrate and respectively connected to different portions of said at least one inductor conductor.

6. A variable inductance element according to claim 5 wherein channels and said two diffusion regions of said at least one switch are extended in length along said at least one inductor conductor.

7. A variable inductance element according to claim 5 further comprising:
   an insulation film formed on the surface of said semiconductor substrate after forming said at least one switch and said at least one inductor conductor,
   perforations formed by removing portions of the insulation film by one of etching and laser light emission, and
   terminals formed by closing the perforations with solder to the extent of protruding slightly from the surface.

8. A variable inductance element according to claim 1 wherein:
   said inductor conductor has a meander shape.

9. A variable inductance element according to claim 8 further comprising:
   two input/output terminals provided at respective ends of said at least one inductor conductor, wherein by operation of said switch a length of said at least one inductor conductor between said two input/output terminals is changed to vary the inductance between said two input/output terminals.

10. A variable inductance element according to claim 8 wherein
    said at least one inductor conductor and said at least one switch are formed on a semiconductor substrate.

11. A variable inductance element according to claim 10 wherein said at least one switch comprises a field effect transistor having two diffusion regions respectively functioning as a source and a drain formed in portions of said semiconductor substrate and respectively connected to different portions of said at least one inductor conductor.

12. A variable inductance element according to claim 11 wherein channels and said two diffusion regions of said at least one switch are extended in length along said at least one inductor conductor.

13. A variable inductance element according to claim 11 further comprising:
    an insulation film formed on the surface of said semiconductor substrate after forming said at least one switch and said at least one inductor conductor,
    perforations formed by removing portions of the insulation film by one of etching and laser light emission, and
    terminals formed by closing the perforations with solder to the extent of protruding slightly from the surface.

14. A variable inductance element according to claim 1 further comprising:
    two input/output terminals provided at respective ends of said at least one inductor conductor, wherein by operation of said switch a length of said at least one inductor conductor between said two input/output terminals is changed to vary the inductance between said two input/output terminals.

15. A variable inductance element according to claim 14 wherein said at least one inductor conductor and said at least one switch are formed on a semiconductor substrate.

16. A variable inductance element according to claim 15 wherein said at least one switch comprises a field effect transistor having two diffusion regions respectively functioning as a source and a drain formed in portions of said semiconductor substrate and respectively connected to different portions of said at least one inductor conductor.

17. A variable inductance element according to claim 16 wherein channels and said two diffusion regions of said at least one switch are extended in length along said at least one inductor conductor.

18. A variable inductance element according to claim 1 wherein said at least one inductor conductor and said at least one switch are formed on a semiconductor substrate.

19. A variable inductance element according to claim 18 wherein said at least one switch comprises a field effect transistor having two diffusion regions respectively functioning as a source and a drain formed in portions of said semiconductor substrate and respectively connected to different portions of said at least one inductor conductor.

20. A variable inductance element according to claim 19 wherein channels and said two diffusion regions of said at least one switch are extended in length along said at least one inductor conductor.

21. A variable inductance element comprising:
   at least one inductor conductor having a predetermined shape, and
   at least one switch functioning to separate and connect portions of said at least one inductor conductor, said at least one inductor conductor used one of independently and in combination with other inductor conductors, said at least one inductor conductor and said at least one switch being formed on a semiconductor substrate, wherein said at least one switch comprises a transmission gate having an n channel transistor and a p channel transistor connected in parallel,
   said n channel and p channel transistors are formed as portions of said semiconductor substrate, and
   two diffusion regions functioning as a source and a drain of each of said n channel and p channel transistors are respectively connected to different portions of said at least one inductor conductor.

22. A variable inductance element according to claim 21 wherein channels and said two diffusion regions of said at least one switch are extended in length along said at least one inductor conductor.

23. A variable inductance element according to claim 21 further comprising:
   an insulation film formed on the surface of said semiconductor substrate after forming said at least one switch and said at least one inductor conductor,
   perforations formed by removing portions of the insulation film by one of etching and laser light emission, and
   terminals formed by closing the perforations with solder to the extent of protruding slightly from the surface.

24. A variable inductance element according to claim 21 wherein said inductor conductor has a spiral shape.

25. A variable inductance element according to claim 24 further comprising:
   two input/output terminals provided at respective ends of said at least one inductor conductor, wherein by operation of said switch, a length of said at least one inductor conductor between said two input/output terminals is changed to vary the inductance between said two input/output terminals.

26. A variable inductance element according to claim 21 wherein said inductor conductor has a meander shape.

27. A variable inductance element according to claim 26 further comprising:
   two input/output terminals provided at respective ends of said at least one inductor conductor, wherein by operation of said switch, a length of said at least one inductor conductor between said two input/output terminals is changed to vary the inductance between said two input/output terminals.

28. A variable inductance element according to claim 21 further comprising:
   two input/output terminals provided at respective ends of said at least one inductor conductor, wherein by operation of said switch a length of said at least one inductor conductor between said two input/output terminals is changed to vary the inductance between said two input/output terminals.

29. A variable inductance element comprising:
   at least one inductor conductor having a predetermined spiral shape, and
   at least one switch functioning to separate and connect portions of said at least one inductor conductor, said at least one inductor conductor used one of independently and in combination with other inductor conductors, wherein said at least one switch includes a switch for cutting off an unnecessary closed loop produced by said at least one inductor conductor according to a switch operating state, wherein said at least one inductor conductor and said at least one switch are formed on a semiconductor substrate,
   wherein said at least one switch comprises a transmission gate having an n channel transistor and a p channel transistor connected in parallel,
   said n channel and p channel transistors are formed as portions of said semiconductor substrate, and
   two diffusion regions functioning as a source and a drain of each of said n channel and p channel transistors are respectively connected to different portions of said at least one inductor conductor.

30. A variable inductance element according to claim 29 wherein channels and said two diffusion regions of said at least one switch are extended in length along said at least one inductor conductor.

31. A variable inductance element according to claim 29 further comprising:
   an insulation film formed on the surface of said semiconductor substrate after forming said at least one switch and said at least one inductor conductor,
   perforations formed by removing portions of the insulation film by one of etching and laser light emission, and
   terminals formed by closing the perforations with solder to the extent of protruding slightly from the surface.

32. A variable inductance element comprising:
   at least one inductor conductor having a predetermined meander shape, and
   at least one switch functioning to separate and connect portions of said at least one inductor conductor, said at least one inductor conductor used one of independently and in combination with other inductor conductors, wherein said at least one switch includes a switch for cutting off an unnecessary closed loop produced by said at least one inductor conductor according to a switch operating state, wherein said at least one inductor conductor and said at least one switch are formed on a semiconductor substrate, wherein said at least one switch comprises a transmission gate having an n channel transistor and a p channel transistor connected in parallel, said n channel and p channel transistors are formed as portions of said semiconductor substrate, and two diffusion regions functioning as a source and a drain of each of said n channel and p channel transistors are respectively connected to different portions of said at least one inductor conductor.

33. A variable inductance element according to claim 32 wherein channels and said two diffusion regions of said at least one switch are extended in length along said at least one inductor conductor.

34. A variable inductance element according to claim 32 further comprising:

an insulation film formed on the surface of said semiconductor substrate after forming said at least one switch and said at least one inductor conductor, perforations formed by removing portions of the insulation film by one of etching and laser light emission, and terminals formed by closing the perforations with solder to the extent of protruding slightly from the surface.

35. A variable inductance element comprising:

at least one inductor conductor having a predetermined shape, at least one switch functioning to separate and connect portions of said at least one inductor conductor, said at least one inductor conductor used one of independently and in combination with other inductor conductors, wherein said at least one switch includes a switch for cutting off an unnecessary closed loop produced by said at least one inductor conductor according to a switch operating state wherein said at least one inductor conductor and said at least one switch are formed on a semiconductor substrate, and two input/output terminals provided at respective ends of said at least one inductor conductor, wherein by operation of said switch a length of said at least one inductor inductor between said two input/output terminals is changed to vary the inductance between said two input/output terminals, wherein said at least one switch comprises a transmission gate having an n channel transistor and a p channel transistor connected in parallel, said n channel and p channel transistors are formed as portions of said semiconductor substrate, and two diffusion regions functioning as a source and a drain of each of said n channel and p channel transistors are respectively connected to different portions of said at least one inductor conductor.

36. A variable inductance element according to claim 35 wherein channels and said two diffusion regions of said at least one switch are extended in length along said at least one inductor conductor.

37. A variable inductance element comprising:

at least one inductor conductor having a predetermined shape, and at least one switch functioning to separate and connect portions of said at least one inductor conductor, said at least one inductor conductor used one of independently and in combination with other inductor conductors, wherein said at least one switch includes a switch for cutting off an unnecessary closed loop produced by said at least one inductor conductor according to a switch operating state, wherein said at least one inductor conductor and said at least one switch are formed on a semiconductor substrate, wherein said at least one switch comprises a transmission gate having an n channel transistor and a p channel transistor connected in parallel, said n channel and p channel transistors are formed as portions of said semiconductor substrate, and two diffusion regions functioning as a source and a drain of each of said n channel and p channel transistors are respectively connected to different portions of said at least one inductor conductor.

38. A variable inductance element according to claim 37 wherein channels and said two diffusion regions of said at least one switch are extended in length along said at least one inductor conductor.

39. A variable inductance element comprising:

at least one inductor conductor having a spiral shape, and at least one switch functioning to separate and connect portions of said at least one inductor conductor, said at least one inductor conductor used one of independently and in combination with other inductor conductors, wherein said at least one switch includes a switch for cutting off an unnecessary closed loop produced by said at least one inductor conductor according to a switch operating state, said at least one inductor conductor and said at least one switch are formed on a semiconductor substrate, wherein said at least one switch comprises a transmission gate having an n channel transistor and a p channel transistor connected in parallel, said n channel and p channel transistors are formed as portions of said semiconductor substrate, and two diffusion regions functioning as a source and a drain of each of said n channel and p channel transistors are respectively connected to different portions of said at least one inductor conductor.

40. A variable inductance element comprising:

at least one inductor conductor having a meander shape, and at least one switch functioning to separate and connect portions of said at least one inductor conductor, said at least one inductor conductor used one of independently and in combination with other inductor conductors, wherein said at least one switch includes a switch for cutting off an unnecessary closed loop produced by said at least one inductor conductor according to a switch operating state, said at least one inductor conductor and said at least one switch are formed on a semiconductor substrate, wherein said at least one switch comprises a transmission gate having an n channel transistor and a p channel transistor connected in parallel, said n channel and p channel transistors are formed as portions of said semiconductor substrate, and two diffusion regions functioning as a source and a drain of each of said n channel and p channel transistors are respectively connected to different portions of said at least one inductor conductor.

41. A variable inductance element comprising:

at least one inductor conductor having a predetermined shape;

at least one switch functioning to separate and connect portions of said at least one inductor conductor, said at least one inductor conductor used one of independently and in combination with other inductor conductors, wherein said at least one switch includes a switch for cutting off an unnecessary closed loop produced by said at least one inductor conductor according to a switch operating state, said at least one inductor conductor and said at least one switch are formed on a semiconductor substrate; and two input/output terminals provided at respective ends of said at least one inductor conductor, wherein by operation of said switch a length of said at least one inductor conductor between said two input/output terminals is changed to vary the inductance between said two input/output terminals, wherein said at least one switch comprises a transmission gate having an n channel transistor and a p channel transistor connected in parallel, said n channel and p channel transistors are formed as portions of said semiconductor substrate, and two diffusion regions functioning as a source and a drain of each of said n channel and p channel transistors are respectively connected to different portions of said at least one inductor conductor.

42. A variable inductance element comprising:

at least one inductor conductor having a predetermined shape, and at least one switch functioning to separate and connect portions of said at least one inductor conductor, said at least one inductor conductor used one of independently and in combination with other inductor conductors, wherein said at least one switch includes a switch for cutting off an unnecessary closed loop produced by said at least one inductor conductor according to a switch operating state, said at least one inductor conductor and said at least one switch are formed on a semiconductor substrate, wherein said at least one switch comprises a transmission gate having an n channel transistor and a p channel transistor connected in parallel, said n channel and p channel transistors are formed as portions of said semiconductor substrate, and two diffusion regions functioning as a source and a drain of each of said n channel and p channel transistors are respectively connected to different portions of said at least one inductor conductor.

* * * * *